US011163319B2

(12) United States Patent
Tuukkanen et al.

(10) Patent No.: US 11,163,319 B2
(45) Date of Patent: *Nov. 2, 2021

(54) LINK LEVEL WIND FACTOR COMPUTATION FOR EFFICIENT DRONE ROUTING USING 3D CITY MAP DATA

(71) Applicant: HERE Global B.V., Eindhoven (NL)

(72) Inventors: Marko Tuukkanen, Schlenzer (DE); Jerome Beaurepaire, Berlin (DE)

(73) Assignee: HERE Global B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/877,049

(22) Filed: May 18, 2020

(65) Prior Publication Data

US 2020/0278695 A1    Sep. 3, 2020

Related U.S. Application Data

(63) Continuation of application No. 15/724,974, filed on Oct. 4, 2017, now Pat. No. 10,698,422.

(51) Int. Cl.
| | | |
|---|---|---|
| *G05D 1/06* | (2006.01) | |
| *G01C 21/36* | (2006.01) | |
| *G05D 1/10* | (2006.01) | |
| *G06F 30/20* | (2020.01) | |
| *G06Q 10/04* | (2012.01) | |

(52) U.S. Cl.
CPC ....... *G05D 1/0615* (2013.01); *G01C 21/3691* (2013.01); *G05D 1/101* (2013.01); *G06F 30/20* (2020.01); *G06Q 10/047* (2013.01); *B64C 2201/145* (2013.01)

(58) Field of Classification Search
CPC ...... G01C 21/20; G01C 21/32; G01C 1/3691; B64C 2201/14; B64C 39/024; B64C 2201/145; G05D 1/101; G05D 1/0615; G06F 30/20
See application file for complete search history.

(56) References Cited

U.S. PATENT DOCUMENTS

| | | | |
|---|---|---|---|
| 6,600,991 B1 * | 7/2003 | Jardin | G01C 21/00 342/26 R |
| 8,818,696 B2 * | 8/2014 | Klooster | G08G 5/0034 701/120 |

(Continued)

OTHER PUBLICATIONS

Airmap, "Airmap for Stakeholders, for Manufacturers, for Developers, for Operators" https://www.airmap.com/, pp. 1-41. Accessed Oct. 4, 2017.

(Continued)

*Primary Examiner* — Mussa A Shaawat
(74) *Attorney, Agent, or Firm* — Lempia Summerfield Katz LLC

(57) ABSTRACT

Embodiments include apparatus and methods for determining link level wind factors and providing routes for drones based on the wind factors. At least a portion of the route corresponds to airspace above a road network. Wind factor values are assigned to a range of altitudes of drone air space above a road link of the road network based on a wind model and stored in a database. The wind model is applied to a location based on wind condition data and three-dimensional (3D) features from 3D map data associated with the location. The route is optimized based on the determined wind factors.

20 Claims, 11 Drawing Sheets

(56) References Cited

U.S. PATENT DOCUMENTS

| | | | | |
|---|---|---|---|---|
| 8,963,353 B1* | 2/2015 | Ekanayake | ............ | F03D 7/0284 |
| | | | | 290/43 |
| 9,406,237 B2* | 8/2016 | Downey | .............. | G07C 5/0808 |
| 9,583,007 B2* | 2/2017 | Ubhi | ....................... | G06Q 50/30 |
| 10,023,323 B1* | 7/2018 | Roberts | .................. | B64D 43/00 |
| 10,269,257 B1* | 4/2019 | Gohl | ......................... | G06T 5/00 |
| 2008/0147366 A1* | 6/2008 | Schutz | .................... | G06T 17/05 |
| | | | | 703/8 |
| 2009/0210109 A1* | 8/2009 | Ravenscroft | ........... | G01C 21/20 |
| | | | | 701/26 |
| 2010/0305767 A1* | 12/2010 | Bengtson | ........... | G05B 19/0421 |
| | | | | 700/287 |
| 2012/0158280 A1* | 6/2012 | Ravenscroft | ......... | G08G 5/0034 |
| | | | | 701/400 |
| 2016/0140851 A1* | 5/2016 | Levy | ....................... | G08G 5/045 |
| | | | | 701/3 |
| 2016/0217694 A1* | 7/2016 | Batla | ...................... | G08G 5/0013 |
| 2016/0253908 A1* | 9/2016 | Chambers | .............. | G08G 5/006 |
| | | | | 701/2 |
| 2016/0371984 A1* | 12/2016 | Macfarlane | ......... | G06K 9/00637 |
| 2017/0011340 A1* | 1/2017 | Gabbai | ............ | G06Q 10/08355 |
| 2017/0039764 A1* | 2/2017 | Hu | .......................... | G06T 17/05 |
| 2017/0076610 A1* | 3/2017 | Liu | ....................... | G08G 5/0013 |
| 2017/0316510 A1* | 11/2017 | Hertz | ..................... | G06Q 40/08 |
| 2018/0143627 A1* | 5/2018 | Lee | ........................ | G08G 5/0013 |
| 2018/0293898 A1* | 10/2018 | Redmann | ............... | G08G 5/006 |
| 2019/0145794 A1* | 5/2019 | Ketchell, III | ...... | G01C 21/3469 |
| | | | | 701/439 |

OTHER PUBLICATIONS

Amorim; et al., "CFD Modelling of the Pedestrian Wind Comfort in a City Avenue", https://www.researchgate.net/profile/Sylvio_De_Freitas/publication/265087608_CFD_modelling_of_the_pedestrian_wind_comfort_in_a_city_avenue/inks/53fe482b0cf283c3583bd211/CFD-modelling-of-the-pedestrian-wind-comfort-in-a-city avenue.pdf? origin=publication_detail, pp. 1-7.

David Galway:, "Urban Wind Modeling with Application to Autonomous Flight", http://atarg.mae.carleton.ca/files/2015/09/thesis_DG.pdf, pp. 1-168.

John Ware; et al. "An Analysis of Wind Field Estimation and Exploitation for Quadrotor Flight in the Urban Canopy Layer", https://groups.csail.mit.edu/rrg/papers/ware_icra16.pdf, pp. 1-8.

* cited by examiner

LINK LEVEL WIND FACTOR COMPUTATION FOR EFFICIENT DRONE ROUTING USING 3D CITY MAP DATA

CROSS REFERENCE TO PRIOR APPLICATION

This application is a continuation under 35 U.S.C. § 120 and 37 C.F.R. § 1.53(b) of U.S. patent application Ser. No. 15/724,974 filed Oct. 4, 2017, which is hereby incorporated by reference in its entirety.

FIELD

The following disclosure relates to the computation of link level wind factors for routing unmanned aerial vehicles or drones using three-dimensional city map data.

BACKGROUND

An unpiloted vehicle or unmanned aerial vehicle (UAV) may be referred to as a drone. In some instances, the larger fixed wing vehicles common in military applications may be referred to as unmanned aerial vehicles and the smaller commercial or private use vehicles, which may operate autonomously or be remotely controlled by a nearby user may be referred to as drones. The term UAV and drone may also encompass other types of autonomous flying devices.

The copter class of UAVs or drones may include any number of spinning blades that create lift by forcing air downward or in other directions. Other types of UAVs may be powered by other propulsion means and use other flight configurations, such as drones using turbines in lieu of spinning blades, jet packs, and fixed wing configurations. Initial uses of UAVs included surveillance and aerial photography. Recent efforts have expanded into many other fields including surveying, package delivery, robot waiters, and other applications. Many UAVs are remotely controlled by human operators. Challenges remain in automatic routing of UAVs.

SUMMARY

In one embodiment, a method is provided for determining link level wind factors for unmanned aerial vehicle (UAV) routing. Three-dimensional (3D) features from 3D map data for a location and road link data for a road link network associated with the location is accessed. Wind condition data for the location is also accessed. A wind model for the location based on the 3D features and the wind condition data is applied. Wind factor values for a plurality of altitudes of UAV air space above a link of the road link network based on the wind model are assigned. Wind factor values and the road link data for the link of the road link network are associated. The wind factor values are stored in a database.

In one embodiment, a method is provided for providing a route for a drone. A route from a starting location to a destination is provided in response to a routing request. At least a portion of the route corresponds to airspace above a road network in a geographic region. A wind factor database is used for the portion of the route that corresponds to airspace above a road network. The wind factor value database includes factors for wind speed, wind direction and altitude above the road network. The route is optimized for a selected criterion.

In another embodiment, an apparatus is provided for determining link level wind factors for unmanned aerial vehicle (UAV) routing. The apparatus includes a database and a controller. The database stores three-dimensional (3D) features and map data for a location. The map data includes road link data for a road link network associated with the location. The controller applies a wind model for the location based on the 3D features and wind condition data for the location and associates wind factor values with the road link data for a link of the road link network. The wind factor values are for a plurality of altitudes of UAV air space above the link of the road link network based on the wind model.

In another embodiment, an apparatus is provided for providing a route for a drone. The apparatus includes a wind factor database, a communication interface, and a processor. The wind factor database stores factors for wind speed, wind direction and altitude above a road network and associated with road link data for the road network. The communication interface receives a routing request. The processor calculates, in response to the routing request, a route from a starting location to a destination. At least a portion of the route corresponds to airspace above the road network in a geographic region selected based on the factors from the wind factor value database and a selected criterion.

BRIEF DESCRIPTION OF THE DRAWINGS

Exemplary embodiments of the present invention are described herein with reference to the following drawings.

DETAILED DESCRIPTION

A geographic database or map database may include road links or road segments of a road link network that correspond to pathways on the ground or elevated from the ground (e.g., ramps or bridges). The road segments, or pathways, may be pedestrian walkways, highways, streets, or other roads. The road segments may also include drone-specific path segments that do not follow a ground path. In cities, a road or path network is usually open in the z-axis, without any buildings over the roads or paths, with the exception of bridges, tunnels, etc. Determining an aerial corridor for a flight path inside a city may be problematic, especially since different building geometries adjacent to specific road links will have a different effect on local wind factors and, as a result, on a chosen flight path. Urban canyons for example, which is the space above a road segment and between buildings, can modify the speed and direction of winds. Wind conditions in urban canyons may affect the direction, energy consumption and travel time of drones. Additionally, for drones adapted for carrying cargo, such as packages, the wind conditions in a city environment may result in the items being carried by the drone becoming damaged or lost. Determining how to generate and utilize wind factor models for drone routing inside urban canyons remains a problem. Therefore, providing link-level routing based on wind factors provides for more efficient flight plans.

The following embodiments present technical solutions to the aforementioned technical challenges and describe incorporating a road link network of a geographic database with wind pattern information. The wind pattern information may be derived from a wind model. The wind model may contain wind pattern simulations for a given area, such as a city or a portion of a city, to estimate the effects of wind on UAVs for varying wind speeds, wind directions, and altitudes. Matching the wind pattern information to the underlying road link network allows for a link level calculation of gains or delays in drone travel time due to wind. This matching of wind patterns to the underlying road link network also simplifies drone routing, since the routing can be done using the same principles of ground level routing algorithms. Drone routing through an urban canyon can be done selectively, depending on the wind conditions. Other routing options would allow to route over the urban canopy in straight paths, route at link-level without penalties (e.g. for calm conditions) or combinations of both. Depending on local drone regulations and/or wind conditions, an optimal route, such as the most effective, most useful, or most functional route, can be sent to the drones. Feedback from drone progress can be sent back to the routing service, which would allow for tuning of the underlying wind model. In this regard, determining wind factors from wind models allow using wind to a drone's advantage while routing the drone.

Figure 1:
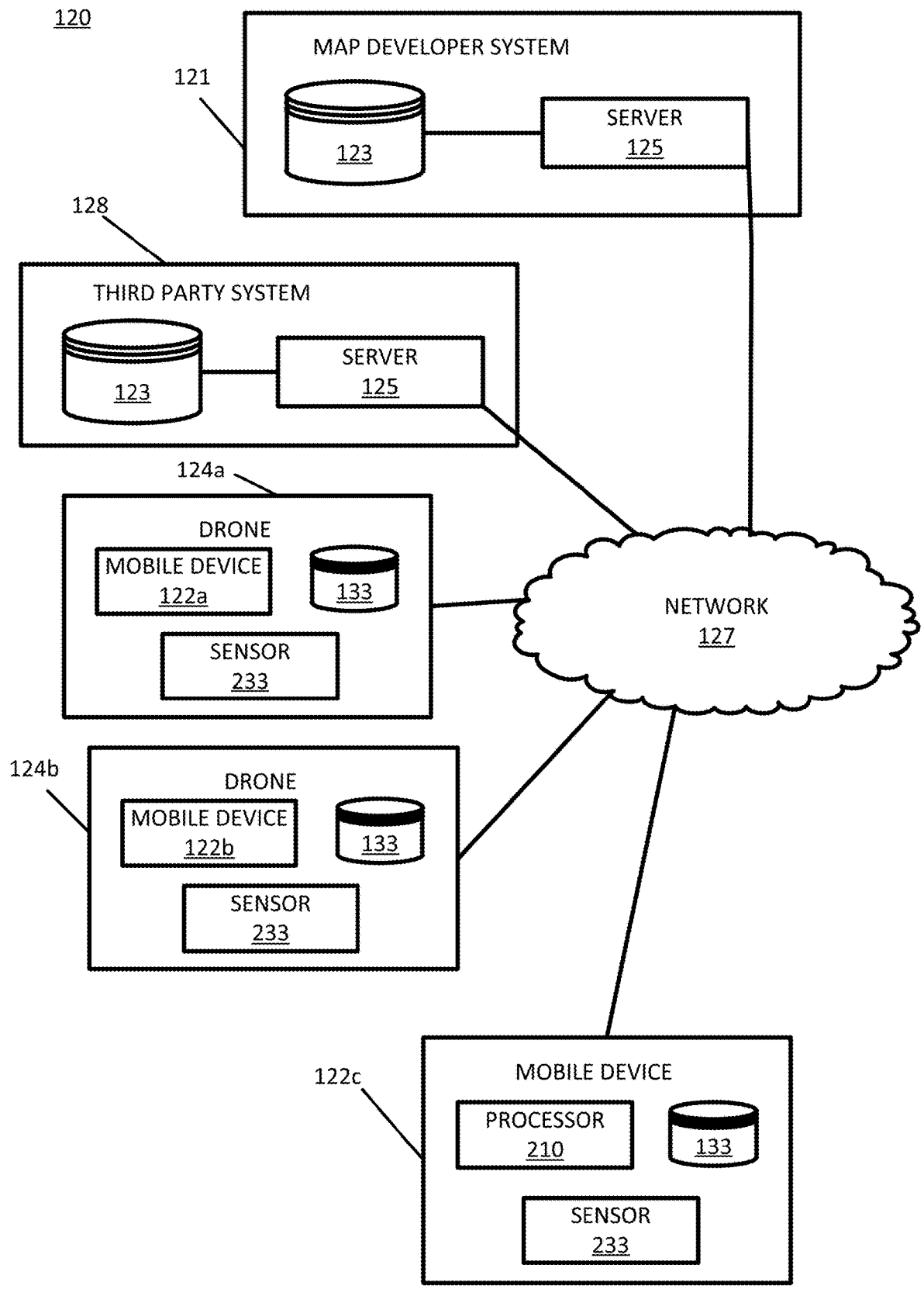
FIG. 1 illustrates an example system for determining link level wind factors for unmanned aerial vehicle routing.

FIG. 1 illustrates an example system 120 for determining link level wind factors for unmanned aerial vehicle routing. In FIG. 1, one or more drones 124a, 124b or mobile devices 122a, 122b, 122c (navigation devices) are connected to a server 125 in either a map developer system 121 or third-party system 128 though the network 127. The drones 124a-b may be directly connected to the server 125 or through an associated mobile device 122a-b. Both the map developer system 121 and third-party system 128, including the servers 125 and geographic or map databases 123, exchange (e.g., receive and send) data from the drones 124a-b and/or mobile devices 122a-c. The mobile devices 122a-c include at least one processor 210 and at least one local database 133. The at least one local database 133 may be modified according to the server 125 and may include a subset of the data of database 123. The mobile devices 122a-c may be carried by vehicles, users or pedestrians, or be standalone devices such as smartphones. The mobile devices 122a-c may also be integrated in drones. Additional, different, or fewer components may be included.

The term database and map database refers to a set of data or map data stored in a storage medium and may not necessarily reflect any specific requirements as to the relational organization of the data or the map data. The database 123 of the map developer system 121 or third-party system 128 may be a geographic database including road segments, building models and/or externally supplied airspace restrictions. The database 123 of the map developer system 121 or third-party system 128 may include three-dimensional (3D) map data and 3D features for a location, as well as road link data for a road link network associated with the location.

The map data may include a network of road, or path, segments. The path segments may represent pedestrian pathways, roads or other streets. The path segments may be defined by a starting point and an ending point, each defined by two coordinates (e.g., latitude and longitude) or three coordinates (e.g., latitude, longitude, and altitude). Curved paths may be represented by a sequence of shorter path segments or by 2D or 3D splines. The splines may be defined by polynomial functions and may be piecewise. The path segments may connect at nodes, which represent intersections.

The database 123 of the map developer system 121 or third-party system 128 may also include wind condition data associated with one or more locations. The wind condition data may be collected in a variety of ways. In one embodiment, the map developer system 121 or third-party system 128 may collect wind condition data from different types of sensors automatically, such as by crowdsourcing. The increased availability of all kinds of sensors on buildings, vehicles, drones, or mobile devices allow for the collection of wind condition data associated with various locations from a multitude of sensors and types of sensors. The drones 124 or mobile devices 122, described in further detail below, may include one or more onboard sensors 233 for sensing certain types of data, including wind condition data. The sensed data may be associated with the location where it was sensed by the onboard sensor(s) 233 and may be stored in local database 133. The drones 124 or mobile devices 122 may collect wind condition data from the onboard sensor(s) 233 and send the wind condition data, including its type and its association to the location where it was sensed, to the map developer system 121 or third party system 128 automatically each time the drones 124 or mobile devices 122 are turned on, or continuously during the entire time the drones 124 or mobile devices 122 are on, or only when the drones 124 or mobile devices 122 are within sensing range of a desired location. Another example is that the drones 124 or mobile devices 122 may collect wind condition data from the onboard sensor(s) 233 and send the wind condition data, and associated location, to the map developer system 121 or third-party system 128 automatically whenever a particular application is in use, such as a navigation system. In another example, the current dynamic performance of a drone 124 at a location may be compared with the expected performance of the drone 124 at the location under calm, or no wind, conditions. This comparison may be performed onboard the drone 124 or on a server 125. The wind condition experienced by the drone 124 may be derived from this comparison. A user of a drone 124 or mobile device 122 may choose whether to automatically send wind condition data and associated location information collected by the onboard sensor(s) 233 by activating a feature on the drone 124 or mobile device 122. In another embodiment, the drone 124 or mobile device 122 may automatically send wind condition data and associated location information collected by the onboard sensor(s) 233 at regular intervals, such as time intervals or distance traveled intervals (e.g., every 5 minutes or every time the device moves more than 5 meters).

In another embodiment, the map developer system 121 or third-party system 128 may collect wind condition data manually, by providing various types of sensors at a location where wind condition data is desired. One example of this manual approach is the map developer or third party sending employees with vehicles, drones, or mobile devices to the desired location to collect multiple types of wind condition data at that desired location.

In another embodiment, the map developer system 121 or third-party system 128 may collect wind condition data semi-automatically, by collecting some wind condition data automatically, as described above, and by collecting other wind condition data manually, as described above. For example, the map developer system 121 or third-party system 128 may collect wind condition data and associated location information from popular locations automatically from the onboard sensor(s) 233 of drones 124 or mobile devices 122 that are within sensing range of a desired location, and may collect wind condition data from remote, hard to reach, unique, or hidden locations manually by providing sensors at those locations, such as employees with vehicles, drones and/or mobile devices.

In one embodiment, the map developer system 121 collects wind condition data simultaneously with collecting data to build a map database. The map developer system 121 may collect the wind condition data along with the map database data either automatically or manually. The collected wind condition data may be stored together with the map database data, or separately. The wind condition data may also be associated with the map database data.

In another embodiment, the map developer system 121 or third-party system 128 may collect wind condition data by purchasing or otherwise obtaining this data from a database developer, such as current weather services or weather stations.

The server 125 of either the map developer system 121 or third-party system 128 is configured to access the 3D map data (including the 3D feature data), the road link data for a road link network associated with the location, and the wind condition data from the database 123. The database 123 may include a lookup table that associates 3D map data, 3D feature data, road link data, and wind condition data with the respective locations. The server 125 may query the lookup table with location identifiers for the 3D map data, 3D feature data, road link data, and wind condition data and receives this data for the respective locations.

Figure 2:
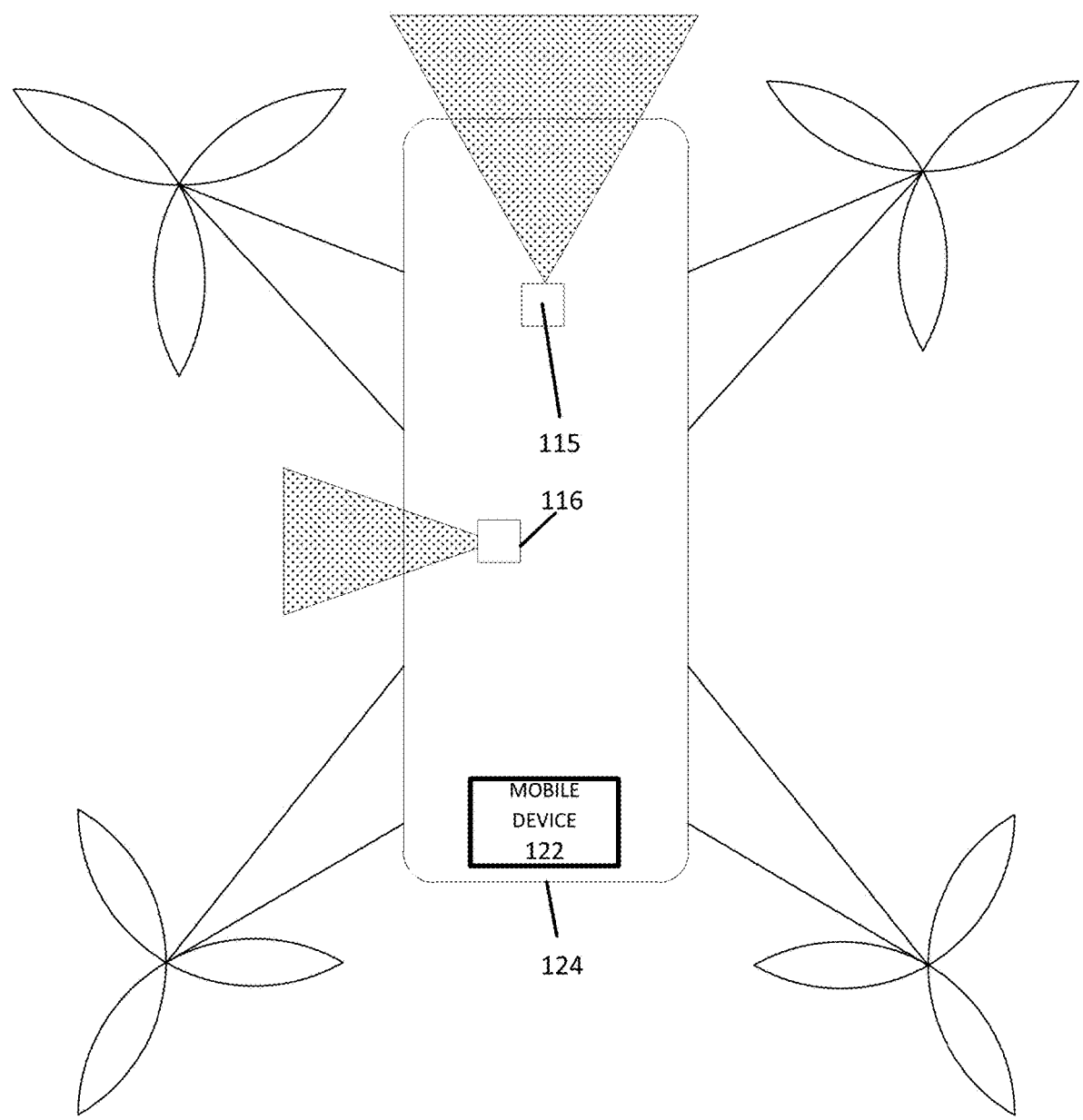
FIG. 2 illustrates an exemplary drone of the system of FIG. 1.

FIG. 2 illustrates an example drone 124 of the system described above in FIG. 1. The drone 124 may be used for surveillance, aerial photography, surveying, package delivery, autonomous aerial taxi services, robot waiters, military operations, law enforcement, precision agriculture, wildlife monitoring, storm tracking, disaster management, and other recreational uses. As discussed above, the drone 124 may be powered by spinning blades that create lift by forcing air downward or in other directions. The drone 124 may also be powered by other propulsion means, such as turbines, and use other flight configurations, such as fixed wings. The drone 124 may also be another type of autonomous flying device, now known or later developed, such as a jet pack worn by a user that is autonomously controlled. The drone 124 may also be used for collecting wind condition data for various locations using various sensors. As described above, the collection of wind condition data via the drone 124 may be done automatically, manually, or semi-automatically. A connected drone 124 includes a communication device and an environment sensor array for reporting the surroundings of the drone 124 to the server 125. The drone 124 may report wind condition data collected from the sensor array to the server 125 automatically, as discussed above, or in response to a request from the server 125. The reported wind condition data may be sent to the server 125 in a manner that associates the wind condition data with the location from where the wind condition data was collected. The connected drone 124 may include an integrated communication device coupled with an in-unit navigation system. The in-unit navigation system may provide the location related information to be reported to the server 125 in association with the reported wind condition data.

The connected drone 124 may include an ad-hoc communication device such as a mobile device 122 or smartphone in communication with a drone system. The communication device connects the drone 124 to a network including at least one other drone 124 and at least one server 125. The network may be the Internet or connected to the internet. The wind condition data collected from the sensor array may also be sent to the server 125 in association with location information provided by either the communication device or the network. The drone 124 may report to the server 125 wind condition data from all available sensors on the drone 124. Alternatively or additionally, the drone 124 may report to the server 125 wind condition data from only a subset of sensors from the set of sensors in the sensor array. The wind condition data may also be stored locally on the drone 124, such as in a memory of the communication device or in-unit navigation system, and may be reported to the server 125 at a later time, such as when the drone 124 is no longer at the location at which it collected the wind condition data. The drone 124 may also use the communication device, such as the mobile device 122, to access wind condition data from the server 125. In this example, the drone 124 may request wind condition data for a location 140 associated with its flight path that the drone 124 has not been to yet. As discussed in more detail below, the drone 124 may utilize the wind condition data received from the server 125 to alter its course, delay or cancel its trip, or adjust its speed, altitude, and/or angle during flight.

The sensor array may include one or more sensors configured to detect surroundings of the drone 124. The sensor array may include multiple sensors. Example sensors include an optical distance system such as a light detection and ranging (LiDAR) system 116, an image capture system 115 such as a camera, a sound distance system such as sound navigation and ranging (SONAR), a radio distancing system such as radio detection and ranging (RADAR) or another sensor. The camera may be a visible spectrum camera, an infrared camera, an ultraviolet camera, or another camera. The LiDAR system 116 and image capture system 115 may collect any data that describes the environment surrounding the drone 124, such as whether the drone 124 is traveling in an urban canyon, whether the wind is blowing, whether the sun is shining, whether the current weather includes precipitation, or other factors external to the drone 124. The drone 124 is not limited to only the LiDAR system 116 and image capture system 115 described above and may include any sensors now known and currently available, or to be available, on the market, or to be developed in the future. Other examples of environmental attributes that the sensor array may collect include temperature, altitude or elevation, lighting, sound or noise level, humidity, atmospheric pressure, wind speed, and the presence of magnetic fields or electromagnetic interference. Any attribute that may be sensed may be collected by the sensor array. In another example, cell tower and wi-fi information, such as available cell tower and wi-fi access points, may also be collected by the sensor array of the drone 124. In yet a further example, the sensor array may collect information pertaining to the specific approach the drone 124 used to travel to a specific location.

The drone 124 may include a global positioning system, a dead reckoning-type system, cellular location system, or combinations of these or other systems, which may be referred to as position circuitry or a position detector. The positioning circuitry may include suitable sensing devices that measure the traveling distance, speed, direction, and so on, of the mobile device 122. The positioning system may also include a receiver and correlation chip to obtain a GPS signal. Alternatively or additionally, the one or more detectors or sensors may include an accelerometer built or embedded into or within the interior of the mobile device 122.

Figure 3:
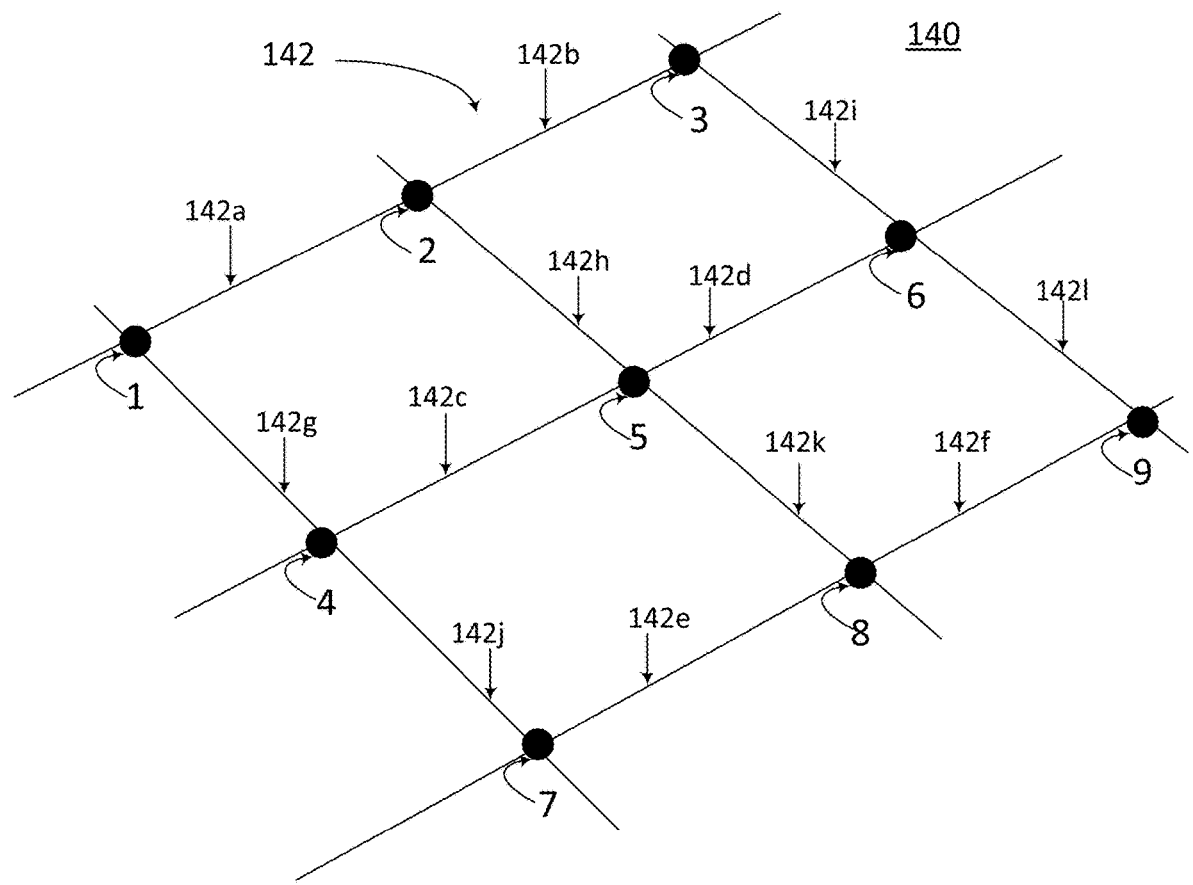
FIG. 3 illustrates an example road link network for a portion of a city.

FIG. 3 illustrates an example road link network 142 associated with a location 140, such as a portion of a city. In this embodiment, the road link network 142 includes a plurality of road links 142*a-l* and a plurality of nodes 1-9. The nodes 1-9 correspond to the end points and intersection points of the road links 142*a-l*. In this embodiment, for example, road link 142*a* is between end points, or nodes 1 and 2. Road link 142*b* is between nodes 2 and 3, etc. As stated above, the road link network 142 associated with a location 140 may be stored in a geographic database or map database and the road links may correspond to pathways on the ground or elevated from the ground (e.g., ramps or bridges). The pathways may be pedestrian walkways, highways, streets, or other roads. The road links may also include drone-specific path segments that do not follow a ground path.

Each road link may be stored in association with various characteristics or properties, which are discussed in more detail below, including road characteristics or road properties. Each node may represent a point location on the surface of the Earth and be represented by a pair of latitude and longitude coordinates. In one embodiment, the distance of each road link between nodes may correspond to a standard distance, such as a city block, one kilometer, or one mile. In other embodiments, the distance of each road link between nodes may vary. The shape of the road links may vary as well, depending on the geographic location associated with the road link network 142. In the example shown in FIG. 3, the road link network 142 is associated with a portion of a city 140 and is represented by road links 142*a-l* having substantially similar distances and shapes, such as a city block.

In ground-level routing, routes may be calculated based on path segments, or road links, associated with portions of a location and the route may be determined based on that location and the underlying road link network 142. Example routing techniques include the A* algorithm and the Dijkstra algorithm. In other words, a route is based on the road link network 142 in the map data of the database 123. This may be referred to as link-level routing (i.e., corresponding the route to individual links of the underlying road link network 142).

Figure 4:
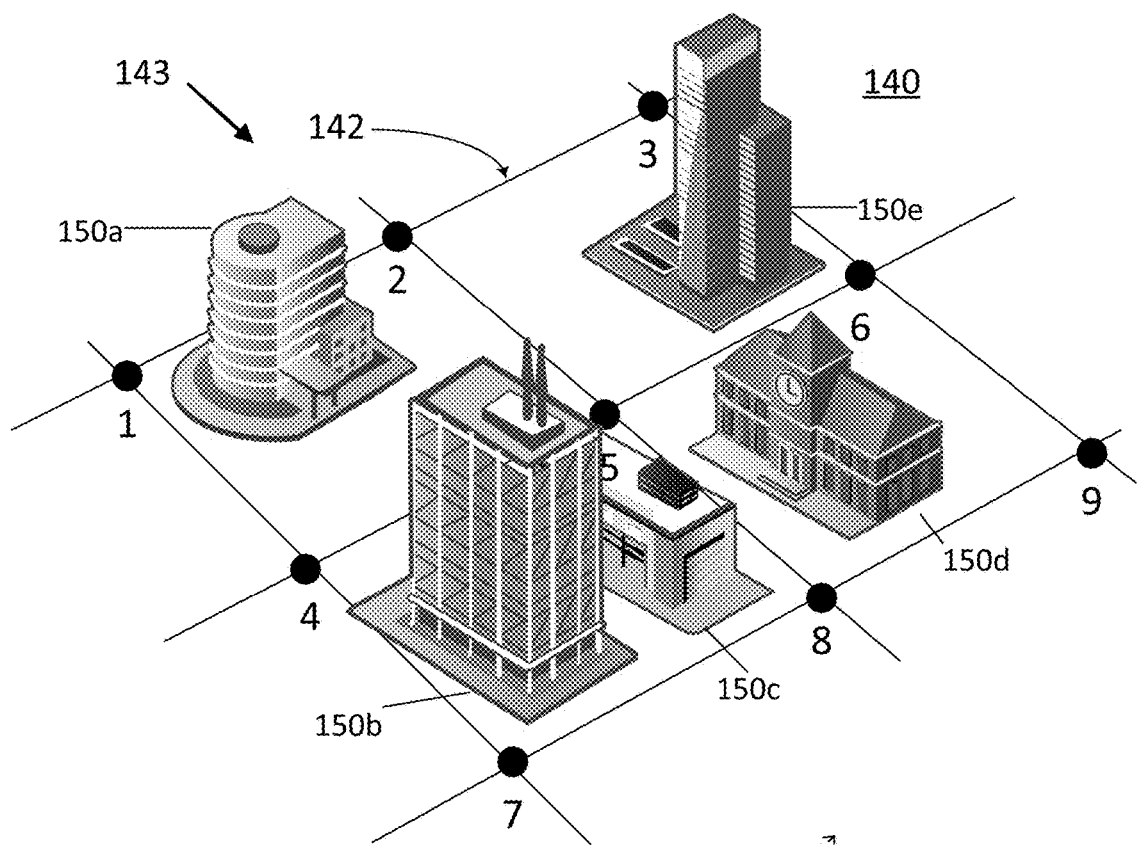
FIG. 4 illustrates 3D map data associated with the road link network of FIG. 3.

FIG. 4 illustrates a building model 143 showing 3D map data associated with the road link network 142 of FIG. 3. The server 125 of either the map developer system 121 or third-party system 128 is configured to access and associate the 3D map data (including the 3D feature data) 150*a-e* with the road link data for a road link network 142 associated with a location 140. In this example, the 3D feature data of the 3D map data includes data associated with at least buildings 150*a-e* of a selected portion of a city. The 3D map data may contain data associated with other types of 3D features as well, such as trees, street signs, traffic signals, and other objects. Through the association of the 3D map data with the underlying road link network 142, the location of the buildings 150*a-e* may be associated with individual road links and/or nodes. For example, building 150*a* of FIG. 4 may be associated with nodes 1, 2, 4 and 5 and may also be associated with road links 142*a*, 142*g*, 142*h*, and 142*c* (see FIG. 3). The 3D map data may also contain distance data corresponding to the distances between objects and a road link or node, or distances between objects, such as distances between buildings.

The 3D map data may contain only natural geographical 3D features, such as mountains, forests, and canyons. The road link network may be any link-node network. In this regard, associating natural geographical 3D features with an underlying link-node network 142 also results in a model showing the association, but does not include buildings. As such, the term building model may include any model that associates 3D features of 3D map data with an underlying link-node network.

The building model 143 may be a three-dimensional building model or a two-dimensional building model. The two-dimensional building model may include building footprints defined by three or more geographic coordinates. The three-dimensional building model may include three-dimensional geometric shapes or geometries defined by three or more three-dimensional coordinates in space.

The building model 143 may be measured using a range finding device (e.g., a light detection and ranging (LIDAR) sensor) mounted on a stationary tripod, a ground vehicle or an aerial vehicle. As the vehicle travels along pathways corresponding to path segments in the map data, the range finding device collects distance data, which may be spatially arranged as a point cloud. The point cloud may be analyzed to identify the buildings or objects in the model. In one alternative, the building model may be created through measuring the locations of buildings manually. The building model may be overlaid on the map data and stored in a map database. Buildings or other objects adjacent to path segments, or nodes, may be indexed according to those path segments or nodes.

In addition or in the alternative to link-node or segment-node maps, the 3D map data may include a 3D surface representation of a road network. The 3D surface representation may include the dimensions of each lane of the road and may be represented in computer graphics. Another example for the map data includes a high definition (HD) or high-resolution map that provides lane-level detail for automated driving, where objects are represented within an accuracy of 10 to 20 cm. In addition to the link-node application, any of the examples herein may be applied to 3D surface representations, HD maps, or other types of map data.

Figure 5:
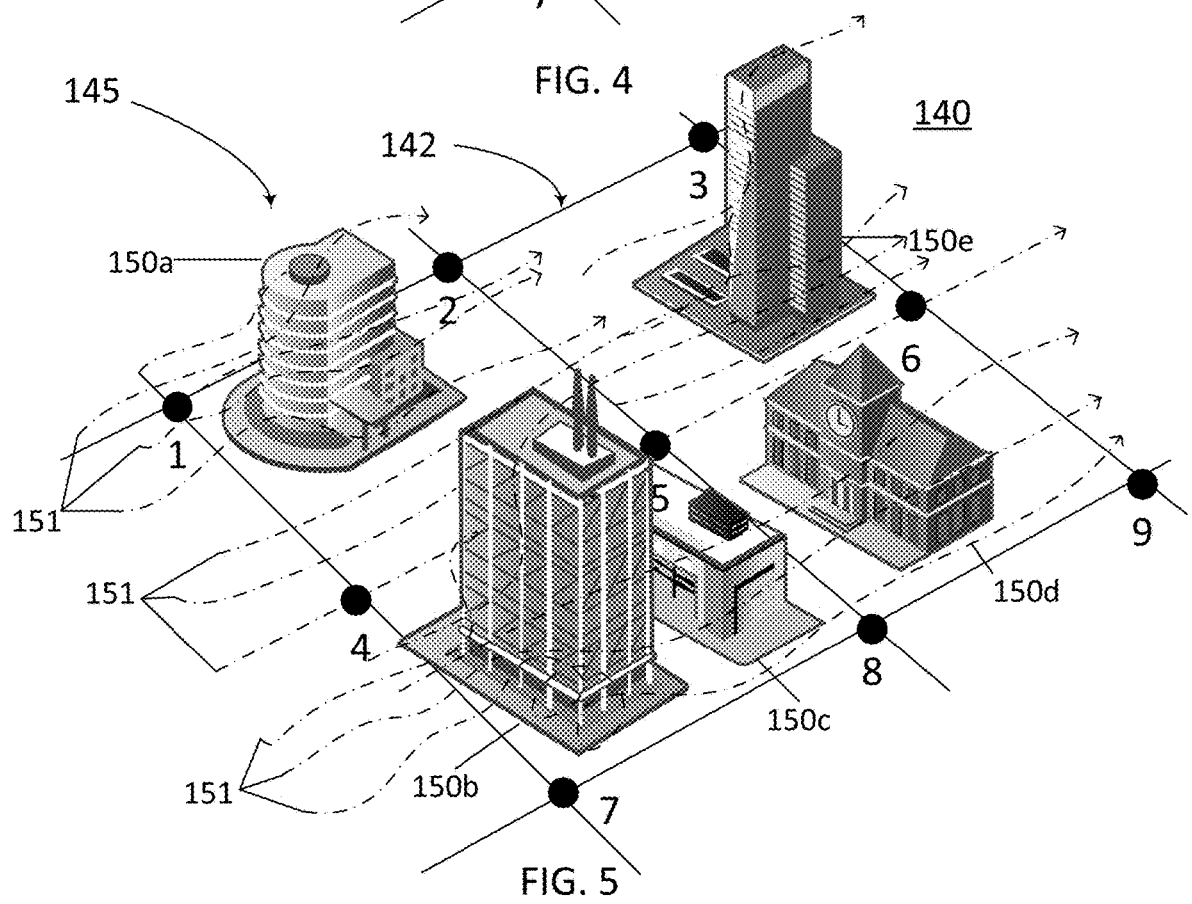
FIG. 5 illustrates an example perspective view of a wind model applied to the road link network and associated 3D map data of FIG. 4.

FIG. 5 illustrates an example perspective view of a wind model 145 applied to the building model 143 of FIG. 4. The wind model 145 may be applied to an entire geographic area, such as an entire city, or to a portion of a geographic area, such as a portion of a city 140. The wind model 145 may be created in a number of ways, as will be described in more detail below. The wind model 145 may pre-compute the consequences, at a link level, of wind on a particular area, such as a city, which allows for determining the effects the wind may have on UAVs operating in that location. The wind model 145 may be pre-computed for varying wind patterns, such as winds with varying direction, angles, altitudes, speeds, etc. In this regard, the wind model 145 allows for determining how different wind patterns will affect a location, regardless of whether the wind ever reaches the location. The wind model 145 may also be computed for current, or real time, wind behavior. The wind model 145 may be based on wind condition data associated with one or more locations. As discussed above, wind condition data may be collected using a variety of techniques, such as by sensors on buildings, vehicles, drones, or mobile devices (i.e., crowdsourcing), by manually collecting the wind condition data, or by purchasing this data from a database developer, such as current weather services or weather stations.

The wind model 145 may be applied to a building model 143 showing 3D map data associated with the road link network 142 by performing a computational fluid dynamics simulation over the 3D map data and road link network 142 associated with a location 140. In one embodiment, the location 140 may include road links adjacent to structures. The location 140 may be further specified as an area including road links adjacent to structures over a specific height. The location 140 may be defined as a polygon encompassing an entire city or a portion of a city. In another embodiment, the structures of the location 140 may be natural geographical structures, such as mountains, forests, or canyons. The fluid dynamics simulation may, for example, take the following into account: the 3D map data (including the 3D feature data) of the location, the road link network at the location, potential prevailing wind directions (e.g.) 1°-360° at the location, potential prevailing wind speeds (e.g. 0 m/s-30 m/s) at the location, varying ranges of altitude levels (e.g. 0 m-Xm, where X may be, for example, 5, 10, 15, 20, etc., or Xm-Ym, such as, for example, 5 m-10 m, 15 m-25 m, etc.) at the location and the volatility of prevailing wind speeds at the varying altitudes, geography of the location, geometry of structures at the location, or any combinations thereof.

The wind model 145 may be generated by a model generator applying the fluid dynamics simulation to the building model 143. The model generator may be, for example, any type of computing device, such as a computer workstation, laptop computer, or a mobile device. Given the demanding nature of computational fluid dynamics computing applications, the model generator may also be a high-performance computer workstation, a cluster of servers, a graphics processing unit (GPU) based computing architecture, and/or a special purpose supercomputer.

The result of the simulation provides an initial wind model 145 showing how wind moves through the different areas of the location 140, such as a city or portion of a city. For example, the wind model 145 may show the locations where the wind speeds increase or decrease depending on the building or structure geometry. The wind model 145 may also show the movement of the wind as it passes over and around the buildings or structures. As shown in FIG. 5, the movement of the wind as it passes through the location 140, including over the road link network 142 and over and around buildings 150*a-e*, is shown as wind patterns 151. For example, the wind model 145 shows multiple wind patterns 151 around building 150*b*. Some wind patterns 151 illustrate how the wind hits the front of the building 150*b* and passes around the sides of the building 150*b*. Other wind patterns 151 show the wind hitting the front of the building 150*b* and then passing over the top of the building 150*b*. Other wind patterns 151 depict the wind forming eddies, or circular movements of air counter to the main wind pattern 151, near the lower front portion of the building 150*b*. Each of these wind patterns 151 may have different effects on drones operating at location 140.

As shown in FIG. 5, there may be many different types of wind patterns 151 in a wind model 145, depending on the characteristics of the location and the geometry of the objects at the location. Wind behavior, such as the direction and strength of the wind, varies depending on, for example, the altitude, surface, and geographical surroundings (e.g., buildings, forest, open area, field, lake, streets, etc.). Therefore, the wind patterns 151 should be generated and stored as additional 3D layers on top of the existing 3D maps. For example, the wind patterns 151 may be generated by the wind model 145 based on an analysis of the geography, buildings, location, and data from sensors, including drone sensors. The wind model 145 may also be stored in a database as a series of vectors for wind patterns at the location 140. The wind model 145 may also include a wind map that identifies wind paths correlated to the road links, or segments, at the location 140. The association between the wind paths and the correlated road links may be stored in a database as discussed above.

Alternatively or additionally, the wind model 145 may be applied by creating a physical 3D model of the location 140 based on the 3D map data and 3D feature data, placing the 3D model of the location 140 in a wind tunnel, and recording the behavior of various wind patterns from the wind tunnel as the wind flows over the 3D model of the location 140. In this example, the physical 3D model of the location 140, such as a city or a portion of a city, may be constructed using 3D printing technologies now known or later developed to print 3D map data.

The wind model 145 may be updated or refined based on a change in either the 3D map data (including the 3D feature data) of the location or the wind condition data used to apply the wind model 145. For example, the 3D geometry of the location may change if a new building is constructed or if an existing building has been altered or removed. In this case, the 3D map data may be updated to reflect these changes. The fluid dynamics simulation can be re-run to compute a new, updated wind model 145. In another example, if the wind model 145 is computed for current, or real time, wind behavior and that wind behavior changes, the fluid dynamics simulation can be re-run to compute a new, updated wind model 145. In one embodiment, the updated wind model 145 may be refined based on real time wind condition data received from sensors at the location 140, such as sensors on buildings, vehicles, drones, or mobile devices. In another embodiment, the updated wind model 145 may be refined based on updated wind condition data provided by a current weather service or weather station.

The wind behavior, or wind patterns, generated by the wind model 145 may be mapped, or associated, to each underlying road link of the road link network 142. A wind factor value, or values, of the wind pattern may be assigned for each link. A wind factor value may indicate the expected wind speed relative to a direction of travel for each link based on the wind model 145. The wind factor value may be expressed as a relative incentive or penalty, or as a wind speed from which an incentive or penalty may be derived. For example, a positive value may indicate an incentive wind factor (i.e., an expected wind speed in the direction of travel of a drone). An incentive wind factor may, for example, indicate a reduction in drone travel time for a drone that is routed over that particular road link, since an expected wind speed in the same direction of travel as the drone may increase the speed of the drone in that direction of travel, thus reducing the travel time. A negative value may indicate a penalty wind factor (i.e., an expected wind speed in the opposite direction of travel of a drone). A penalty wind factor may, for example, indicate an increase in drone travel time for a drone that is routed over that particular road link, since an expected wind speed in the opposite direction of travel as the drone may decrease the speed of the drone in that direction of travel, thus increasing the travel time. In another example, the inverse is also possible, where a positive value indicates a penalty wind factor and a negative value indicates an incentive wind factor. In one embodiment, there may be a plurality of wind factor values for each link of the road link network 142. For example, each road link may be associated with a wind factor value for at least a prevailing wind heading, a prevailing wind speed, and altitude. For a prevailing wind direction, or heading, road links will have a positive wind factor value in one direction, and the same negative value in the opposite direction.

Each time the wind model 145 is updated or refined based on a change in either the 3D map data (including the 3D feature data) of the location or the wind condition data used to apply the wind model 145 at the location 140, as discussed above, the assigned wind factor values are re-assigned as well. For example, if the wind model 145 is computed for current, or real time, wind behavior and that wind behavior changes, the wind factor values can be re-assigned to the corresponding road links based on real time wind condition data received from sensors at the location 140, such as sensors on buildings, vehicles, drones, or mobile devices. In another embodiment, the updated wind model 145 may be refined based on updated wind condition data provided by a current weather service or weather station. In that example, the wind factor values may be re-assigned based on the updated wind condition data provided by the weather service or station. In yet another example, if the 3D map data is updated to reflect a change in the 3D geometry of the location, such as a new building having been constructed or an existing building having been altered or removed, the wind factor values may be re-assigned based on the updated 3D map data.

The wind factor values may be included in a wind factor data structure for each road link. Therefore, the wind model 145 may be represented as a series of wind factor data structures, where each wind factor data structure contains wind factor values for different altitudes, prevailing wind speeds, and prevailing wind headings for different road links, along with a wind factor volatility value indicative of how much a wind factor fluctuates at a corresponding altitude. The wind factor volatility value may be expressed as a relative value, a speed range, or as an acceleration or deceleration. As discussed above, the altitude, prevailing wind speed, prevailing wind heading values, and wind factor volatility values are obtained from the wind model 145 and the wind factor values are assigned once the wind model 145 is applied to a location 140. The altitude, prevailing wind speed, prevailing wind heading, wind factor values, and wind factor volatility values are then associated with a particular road link and stored in a data structure for that particular road link. For example, once the wind model 145 of FIG. 5 is applied to the building model 143 of FIG. 4, a wind factor data structure for road link 142*a* of FIG. 3 may include data entries for at least one altitude, where each data entry may represent a North, South, East and West prevailing wind heading. The data entries of the wind factor data structure may also represent at least the prevailing wind heading, prevailing wind speed, assigned wind factor value (i.e., expected wind speed on the link based on the applied wind model 145), and wind factor volatility value. The wind factor data structure functions to allow a query for wind factor values for a particular road link, or links, to provide an optimal route for a drone. For example, to determine a route over one or more road links, the penalty or incentive (i.e. wind factor value) for each road link along the route needs to be determined. To determine the wind factor value for any given road link, a query for a wind factor value for that road link is made by specifying the road link ID, prevailing wind direction, prevailing wind speed, and altitude(s), where altitude may be optional. If one or more altitudes were provided in the query, the query may return the wind factor values and wind factor volatility values for the corresponding altitudes of each road link. The query may also return a single wind factor value and wind factor volatility value for a single altitude specified in a constant-altitude query. In one example, if the query contains no altitude input values, the query may still return results for a range of altitudes for each road link. Determining multiple altitude dependent wind factor values and wind factor volatility values is advantageous in that it leads to routes that allow for altitude changes. For example, having a route with multiple altitude dependent wind factor values and wind factor volatility values allows a drone to fly at the most convenient altitude per road link. In another example, the absence of an altitude input value may be interpreted as a query for the optimum incentive for a specified road link.

Other input parameters for the query may include a maximum or minimum incentive, a maximum or minimum penalty, or a balanced or smooth transition between wind factor values of adjacent road links. In this case, the query may return wind factor values and wind factor volatility values for one or more altitudes of one or more road links even if the query did not contain an altitude input value.

In another example, rather than include wind headings for cardinal directions, one or more wind attributes such as the altitude, prevailing wind speed, the wind factor value, or the wind factor volatility value may be stored in the wind factor data structure for the direction of vehicular travel along the road link. For example, a road link from point A to point B may only include the altitude, prevailing wind speed, the wind factor value, and the wind factor volatility value for the wind direction from point A to point B (i.e., a vector in the direction from point A to point B). The prevailing wind speed, altitude, wind factor value, and wind factor volatility value may be projected onto the vector from point A to point B. Similarly, for the road link, the wind factor data structure may include the prevailing wind speed, altitude, wind factor value, and wind factor volatility value for the opposite direction, which is wind direction from point B to point A, and/or the perpendicular vectors that are perpendicular to the road link.

The wind factor values in the data structures could also be interpreted as threshold values by a routing algorithm for blocking specific street segments or indicating which road links are not to be traversed. For example, a routing algorithm may interpret a wind factor value$<-9$ to be a very high penalty, indicative of a blocked road segment. These threshold values may be set artificially if links are not to be traversed. Alternatively or additionally, the threshold values may be used to determine actions of the drone 124 and/or to control the drone 124 to perform those actions. For example, if a wind factor value is $-10$ or worse, indicating a high degree of likelihood that the wind conditions will negatively impact the drone 124, the drone 124 may be instructed to land at a nearest safe zone or return to the route origin. In another example, routing requests may indicate certain threshold values for the wind factors. For instance, if a drone 124 is carrying fragile cargo, a routing request from that drone 124 may indicate a wind factor threshold value of $-2$ in order to avoid routes having wind conditions that may damage the cargo (i.e., routes with wind factor values less/worse than $-2$). In this regard, the route may not be the most efficient, but it would the most optimal route since it would be the safest for the type of cargo the drone 124 is carrying. In another example, a routing request may indicate a certain threshold based on the specification or energy level of a drone 124. In yet another example, if the wind factor value is approximately zero (i.e. neutral), which indicates that the potential impact of the wind conditions on the drone 124 is negligible, the drone 124 may be instructed to fly the shortest or fastest route. In some cases, the shortest or fastest route may not be associated with the underlying road link network 142, assuming local regulations permit drones flying in straight paths over the urban canopy. In this regard, at least a portion of the drone route may correspond to airspace that is not above a particular road link or road link network 142. For instance, if the most optimal route is the fastest route and the fastest route requires the drone to fly over a portion of a geographic area that does not contain road links or nodes, such as a forested area in the middle of a city or a field just outside the city limits, at least a portion of the drone route may not be associated with an underlying road link network 142. In this example, the airspace above the forested area or field, which is not above a road link network 142, may also be assigned a wind factor value to indicate the estimated wind speed for a given wind heading and altitude.

The wind factor values and wind data structures may be stored in a database. The wind factor values may be stored as attributes or data layers associated with the location. For example, each wind factor value may be associated with a link ID for a particular road link of the underlying road link network 142. In this regard, a wind factor value associated with a particular road link may be retrieved from the wind model 145 in the database by querying the model, or database, with parameters for the road link in question (i.e., link ID), prevailing wind direction, prevailing wind speed, altitude and/or wind factor volatility value. The query may return the wind factor for varying altitudes at the location. Having multiple altitude-dependent wind factors allows for routes to be planned such that drones 124 fly at the most convenient, or optimal, altitude per link. The query may return the wind factor value for a single altitude if the altitude specified in the routing request is constant. The wind factor values and wind data structures may also be arranged in lookup tables, as a graph database, key-value storage, etc.

The server 125 of either the map developer system 121 or third-party system 128 is configured to access the 3D map data (including the 3D feature data), the road link data for a road link network 142 associated with the location 140, and the wind condition data from the database 123, and apply the wind model 145 to the building model 143 associated with the location 140 based on the accessed 3D map data and wind condition data. The database 123 may store the results of the wind model 145 and may associate the wind model 145 with the location 140 to which it was applied. Accessing the 3D map data and the road link data and applying the wind model 145 to the building model 143 associated with the location 140 may be performed on-demand, such as when a drone route is requested. The database 123 may include a lookup table that associates 3D map data, 3D feature data, road link data, building model 143, wind condition data, and the wind model 145 results with the respective locations. The server 125 may query the lookup table with location identifiers for the 3D map data, 3D feature data, road link data, building model data, wind condition data, and wind model data and receive this data for the respective locations.

The server 125 of either the map developer system 121 or third-party system 128 is configured to assign wind factor values based on the wind model 145. As discussed above, wind factor values may vary in dependence of altitude of UAV air space above each link of the road link network 142, since wind factor values for a given road link may be different at different altitudes. For example, the wind model 145 may indicate that wind patterns near the ground may flow in one direction, but that wind flow patterns at higher altitudes, such as above buildings, tree canopies, etc., may flow in the opposite direction. In this regard, a particular road link may have opposite wind factor values for different altitudes. The availability of wind factor values for varying altitudes allows for the routing of multiple drones in the same air space above a particular road link. For example, one drone may be routed over a particular road link at a low altitude in one direction, while a second drone may be routed over the same road link at a higher altitude in the opposite direction.

The server 125 is also configured to associate the assigned wind factor values to road link data, such as link IDs, for each road link of the road link network 142 that corresponds to each of the assigned wind factor values. The database 123 may store the associated wind factor values and may include a lookup table that associates the assigned wind factor values to road link IDs and wind parameters, such as wind direction, wind speed, and/or altitude, associated with the location 140. The server 125 may query the lookup table with link IDs and wind parameters and receive this data for the respective locations and parameters. As discussed above, the server 125 may also be configured to associate assigned wind factor values to airspace above a geographic area that is not associated with a road link network 142. The database 123 may store the associated wind factor values for airspace not above a road link network 142 in the same manner the database 123 stores the wind factor values associated with a road link network 142, as described above.

As discussed above, wind patterns may either positively or negatively affect a drone's flight path. Choosing the best path for a drone, or the most effective, useful, or functional path, may depend on certain criteria and may be referred to as optimizing the path, or route. There are a number of criteria that may be used for optimizing a route. For example, wind flowing in the same direction as the drone may allow the drone to fly faster and conserve energy usage, thus extending the range of the drone. Conserving energy, or reducing energy consumption, may be a selected criterion for choosing the most effective or most useful route. In this regard, minimal energy consumption would be a selected criterion for optimizing a route. However, a drone flying into the wind flies slower and uses more energy, thus reducing the range of the drone. Wind patterns lateral to a drone's flight path may cause the drone to go off course. Strong wind patterns in any direction may lead to difficult maneuvering of the drone or, worse yet, cause the drone to crash into the ground or an adjacent structure. Minimizing the likelihood of crashing a drone may be another criterion used to choose the best route (i.e., optimize the route). For instance, specifying flight altitudes with low wind speeds or low wind volatility, or enough altitude for a drone to recover from a wind gust, may also be criteria used to minimize the likelihood of crashing. Changes in altitude may be regulated with constraints. For example, if the altitude change between road links is too steep, such that it would consume more energy, a less steep change (or no change) may be recommended. In another example, if too many UAVs are already at a certain altitude in a road link, an alternate altitude may be recommended. The ranges and granularity of the ranges can be selected accordingly to optimize the drone route and the use of computing resources.

Figure 6:
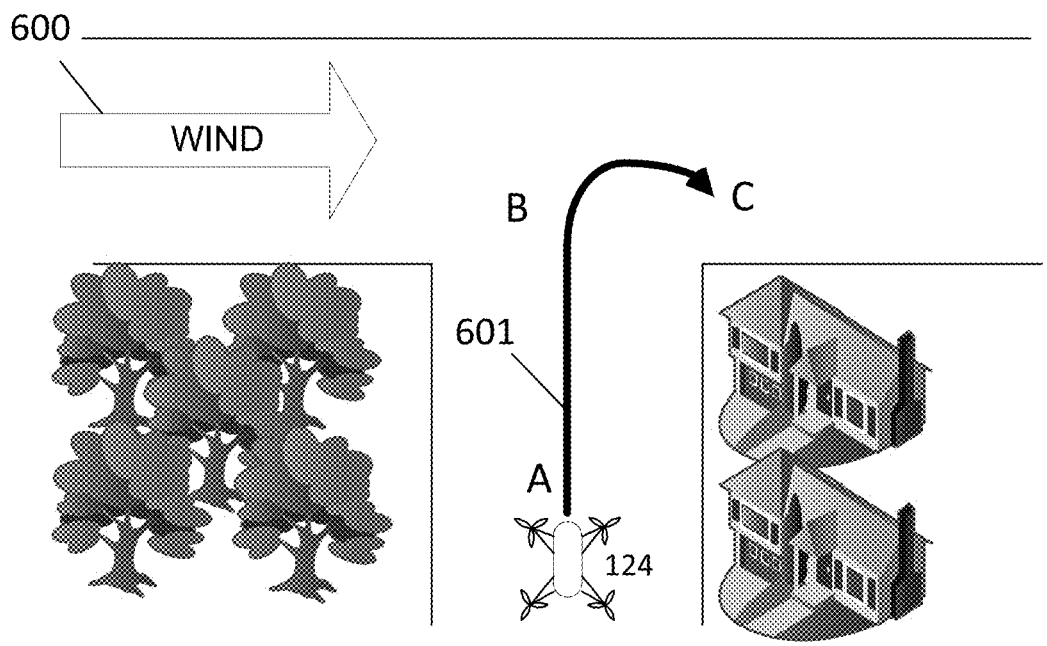
FIG. 6 illustrates an example of a drone being negatively impacted by wind.

FIG. 6 shows an example of a drone 124 being negatively impacted by a wind pattern having a prevailing eastward wind direction 600. The drone 124 is not impacted by the wind 600 when flying between the forest and the houses along segment A-B at an altitude of approximately between 2 and 10 meters. The drone 124 proceeds northward (upwards in FIG. 6) along the drone flight path 601. When the drone 124 reaches position B, the wind 600 pushes the drone 124 eastward (to the right in FIG. 6). Without any additional maneuvers, the drone 124 moves to the east, flips over and eventually crashes to the ground at position C. Even though some drones may be equipped with an automatic mechanism to prevent the drone from tipping over due to wind gusts or during landing, those mechanisms may not be able to proactively adjust the angle, speed, or height of the drone based on expected wind patterns.

Therefore, it is advantageous to utilize wind models based on 3D map data associated with an underlying road link network 142 as discussed above for deriving and optimizing drone routes. Drones having either the measured data of the current wind patterns, or the modeled data for predicted wind patterns, including the wind direction and strength at different altitudes, can use this data proactively to adjust the drone altitude, speed, and angle during flight. This ensures the drone has the best or most efficient flight possible given the current wind patterns.

Figure 7:
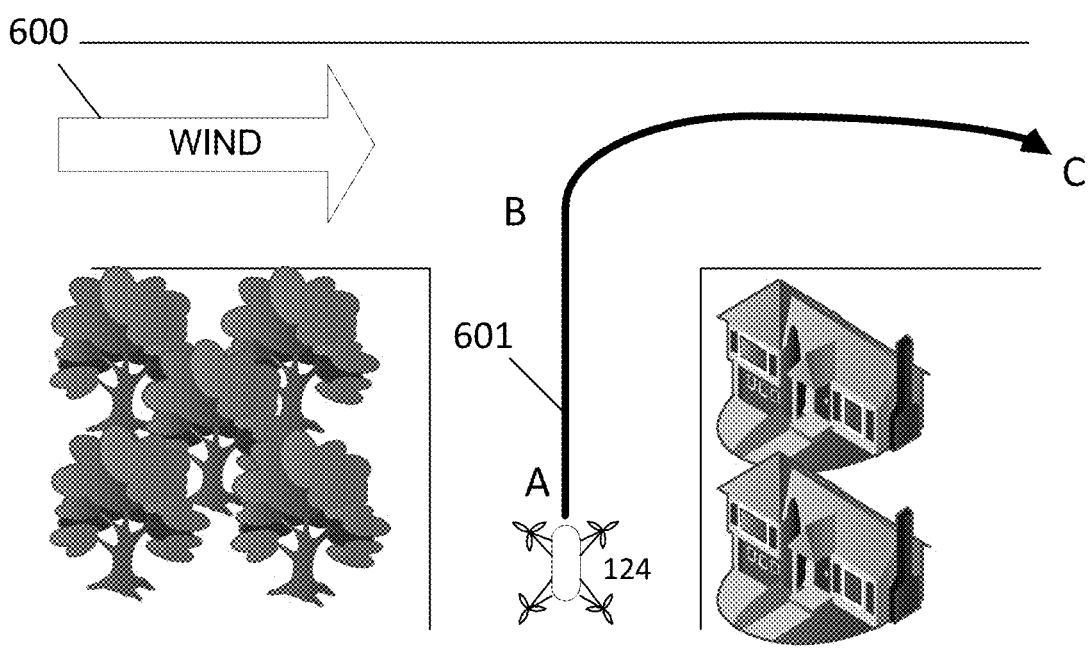
FIG. 7 illustrates an example of a drone utilizing wind condition data proactively to adjust drone settings.

FIG. 7 shows an example of a drone 124 utilizing stored or modeled wind condition data proactively to adjust the drone 124 altitude, speed, and angle when flying along the drone flight path 601 from position A to C. In this example, the selected criterion for optimizing the route may be least likelihood of crashing, minimizing energy consumption, or both. The drone 124, having received data indicative of the prevailing eastward wind direction 600 from the wind model 145, adjusts its altitude and/or angle prior to reaching position B in order to compensate for the wind 600 and a potential wind gust. The drone 124 is therefore able to avoid tipping over and crashing. After reaching position B, the drone 124 may again adjust its altitude and angle to take advantage of the wind 600 to the drone's 124 benefit. By making the flight path adjustments based on the known wind conditions from the wind model 145, the drone 124 may increase its speed and save energy, thereby extending its range to at least position C.

In response to a routing request from a drone 124 that includes a start location and destination location, as well as any operating wind speed thresholds or desired altitudes, the server 125 may calculate a drone route through the air space above the underlying road link network 142 associated with the location 140 based on the wind factor values. This is referred to as link level routing. In making the route calculation, the server 125 may identify and select wind factor values that indicate incentives over wind factor values that indicate penalties. Determining whether current or predicted wind patterns will affect the route travel time ensures that the travel time of the drone 124 is optimal. In calculating the most efficient route for the drone 124, the server 125 may take the overall route travel time into consideration as opposed to just identifying and selecting wind factor values that indicate incentives over penalties. For example, a route along a road link having a distance of 10 meters and a negative wind factor value of −2 may still be more efficient than a route along a different road link having a distance of 100 meters and a positive wind factor value of 1. In this case, the most optimal route may not be the shortest route. Wind factor values may also be provided as a positive/negative speed, such as +/− meters/second, to provide the expected wind speed for a specific road link. For instance, in the example above, the wind factor value for the road link having a distance of 10 meters may be −2 m/s and the wind factor value for the different road link having a distance of 100 meters may be 1 m/s. The combination of a wind factor value that indicates a penalty along with the distance of the road link having that penalty wind factor value may be referred to as an "edge weight." The server 125 may also calculate the route based on any threshold values either indicated in the wind factor data structure for the road link or provided by the drone 124 requesting the route, as discussed above.

The server 125, when making the route calculation, may also identify and take into consideration existing routes, or flight paths, of other drones that are also associated with the location 140. Taking other drone flight paths into consideration may avoid potential collisions of the drone 124 with other drones while enroute. The server 125 may access a database that contains drone data, including drone location, drone altitude, and drone flight paths for other drones. The database may include a lookup table that associates drone locations with drone altitudes and computed flight paths. The server 125 may query the lookup table with other drone data and receive this data for the respective locations, altitudes and flight paths of other drones. Once the server 125 identifies other drone flight paths associated with the location 140, the server 125 may calculate a drone 124 route based on the other drone flight paths associated with the location 140. In this regard, the server 125 may avoid calculating a drone 124 route that may lead to a collision with another drone at the location 140 with the same or similar route as the drone 124.

Once the server 125 calculates the most efficient route for the drone 124 at the location 140, the server 125 may send the route to the drone 124 having a flight path associated with the location 140. The server 125 may provide the route to the drone 124 in response to a routing request for a route from a starting location to a destination. The drone 124, in response to receiving the route from the server 125, may adapt its flight path accordingly. In one example, the drone 124 may completely alter its original flight path to correspond to the proposed route. In another example, the drone 124 may start its flight path sooner than it normally would have, or postpone or cancel its flight path, depending on the proposed route. As described above, in addition to altering its course based on the proposed route, the drone 124 may also adjust its speed, altitude, and angle based on the wind condition data.

The server 125 may use an algorithm to perform the link level routing described above. The algorithm may determine which route through a location 140, for a given altitude, provides the most advantageous wind factor value and use that information for calculating the route. In one example of optimizing a route, the most efficient route may be derived by maximizing wind factor values that indicate incentives and minimize wind factor values that indicate penalties. This is different than the usual shortest or fastest route used in ground level routing. In another example, the route may be optimized for a selected criterion, such as minimal time to traverse the route, minimal energy consumption, or the least likelihood of crashing, as described above. Also as described above, the algorithm may consider the computed routes of other drones and their location at different altitudes at different times to avoid the scenario of flight paths of drones cutting across each other in order to avoid a chance for collision.

A drone 124 may send a query for a flight path based on a starting location and destination and receive a calculated route involving the link level routing, as described above, that takes wind characteristics at the location 140 into consideration. In one embodiment, once the drone 124 begins flying the proposed route, the drone 140 may report its progress along the different route segments in order to assess and eventually refine the computed wind factors. The information received from the drone 124 may be processed offline, to update the wind factor values for the model, or a hybrid model may use weighted wind factors in combination with probe data from the drone 124 to derive a more accurate route and time estimate.

Real-time wind condition data may also improve the safety of the drone 124. In one embodiment, the drone 124 may report sudden unexpected wind gusts deviating from the computed wind factors as abnormalities, which may be used to alert other drones flying in or near the location 140. For example, when a sudden severe weather anomaly (e.g. tornado) hits an area (e.g., a city), the precomputed wind paths might no longer apply. Therefore, the system 120 may be required to calculate the impacts that the sudden wind gust may have on drones operating in the area. In such case, the system 120 may route the drone 124 over the safest road links and define a route or landing location that in usual circumstances would not be considered optimal.

In another embodiment of improving the safety of the drone 124 based on real-time wind condition data, the system 120 may determine that it is more advantageous to stop or pause the drone 124 along the route and wait until the sudden severe weather anomaly passes, or to instruct the drone 124 to return to its route origin. In this regard, the drone's 124 battery or energy consumption is not wasted on flying against a strong wind and the risk of damaging the drone 124 is minimized. In this example, the wind model 145, or a wind map created by the wind model 145, may define, either manually or automatically, selected spots or zones at the location 140 where the drone 124 may safely "pause" and wait until the sudden severe weather anomaly passes. A drone 124 may "pause" by landing or hovering in a safe zone until being further instructed or authorized by the system 120 or an operator to continue along its calculated route. The system 120, based on received real-time wind condition data as described above, may send alerts to the drone 124 while enroute that instruct the drone 124 whether to pause (e.g., land or hover) or return to the route point of origin, such as a drone station.

As discussed above, link level routing of a drone 124 based on wind factors is useful when the wind characteristics for a location 140 indicate a potential for the wind to negatively affect the drone 124, such as causing travel time delays, causing the drone 124 to go off course and/or crash, increasing the drone's 124 energy consumption, or causing the drone 124 to lose or damage cargo the drone 124 may be carrying. In that scenario, a drone 124 route is determined that maximizes incentives (i.e., reduction in travel time and increased safety) and minimizes penalties (i.e., increase in travel time and decreased safety). However, if the prevailing wind affecting a location 140, such as a city, is calm or low, and thus likely to cause wind factor values to be approximately zero (i.e. neutral), routing can be done as per regular ground-level routing, which is routing based on the shortest/ fastest path, without querying wind factor models as described above for the system 120 of FIG. 1. In one embodiment, for example, an empirical measure that relates wind speed to observed conditions at sea or on land, such as the Beaufort scale, may be used to choose when to apply wind factors. In this example, the system 120 may determine a shortest route through the air space above a road link network 142 associated with the location 140 or a straightest route based on the road link network 142. As described above, the shortest route may also include at least a portion of the route through airspace not above a road link network 142.

A straight A-to-B route over the urban canopy may also be compared to the best possible link-level route for the available winds. If it is allowed by local regulations to fly the drone 124 over the urban canopy, the straight route may be preferred. It may be advantageous to route the drone 124 via straight routes when the flight path of the drone 124 is in the same direction of the wind pattern and route the drone 124 using the link level routing described above when the flight path of the drone is in the opposite direction of the wind pattern. In this regard, the drone 124 is able to utilize the advantages that the urban canyon wind flow may provide.

When the wind behavior associated with a certain road link is consistent all or most of the time, the information and precomputed models for that link may be used to define a default flight direction for that link or city area. This would essentially create "one-way streets" for drones, thus optimizing the usage of air space and reducing the risks of collisions due to drone traffic going in opposite directions. These "one-way streets" for drones may also be created for different altitudes. As discussed above, one drone may be routed over a particular road link at a low altitude in one direction, while a second drone may be routed over the same road link at a higher altitude in the opposite direction.

Once the server 125 sends the route to a drone 124 having a flight path associated with the location 140, the server 125 or the mobile device 122 may generate flight commands to navigate the drone 124 through the route. The commands may include directional commands in six degrees of freedom (e.g., clockwise or counterclockwise in yaw, pitch and/or roll). The directional commands may be created based on the geographic bounds of the air space at the location 140. The server 125 or the mobile device 122 may control the drone 124 through the route. In other words, the directional commands control the drone 124 to fly the provided route.

In another example, the drone 124 may be controlled by radio or other wireless signals received by the mobile device 122. The route of the drone 124 may be limited by the air space available at the location 140. The available air space at the location 140 may be pre-loaded in the mobile device 122 or transmitted to the mobile device 122. For example, a user may control the drone 124 with a remote control. The server 125 or the mobile device 122 may monitor the flight of the drone 124 and issue a warning if the drone 124 veers off course or comes within a predetermined distance to an object at the location 140, such as a building, structure, tree, sign, power pole, vehicle, or other drone.

The mobile device 122 may be a personal navigation device ("PND"), a portable navigation device smart phone, a mobile phone, a personal digital assistant ("PDA"), a car, a tablet computer, a notebook computer, and/or any other known or later developed connected device or personal computer. Non-limiting embodiments of navigation devices may also include relational database service devices, mobile phone devices, or car navigation devices.

Figure 8:
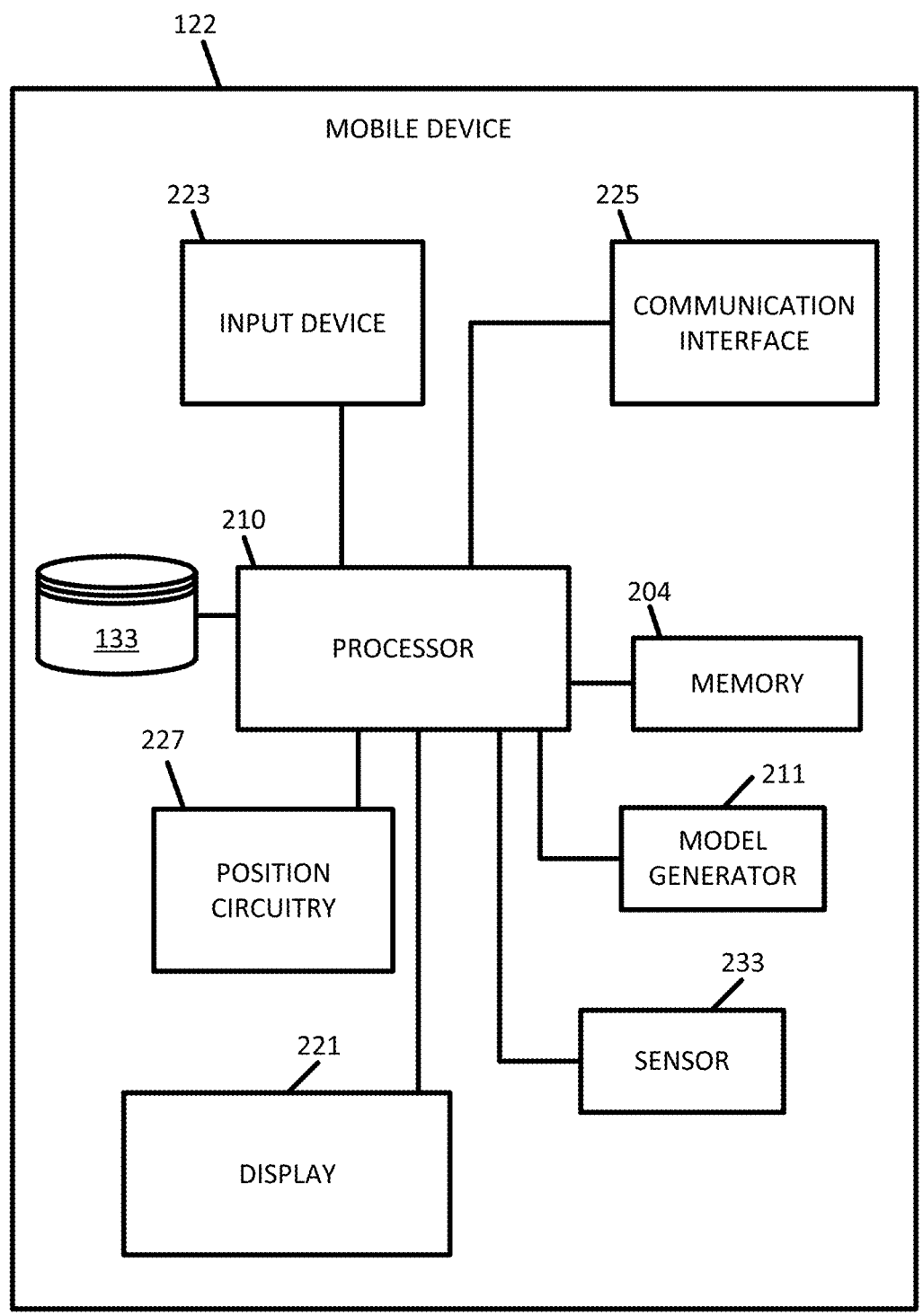
FIG. 8 illustrates an exemplary mobile device of the system of FIG. 1.

FIG. 8 illustrates an exemplary mobile device 122 (or navigation device 122) of the system of FIG. 1. The mobile device 122 includes a processor 210, a local database 133, a memory 204, an input device 223, a communication interface 225, position circuitry 227, a display 221, a model generator 211 and one or more sensors 233. The one or more sensors 233 may be a camera or another type of sensor and may be internal or external to the mobile device 122. Additional, different, or fewer components are possible for the mobile device 122. The mobile device 122 is configured to execute routing algorithms to determine an optimum route to travel along a network of navigable path segments from an origin location to a destination location in a geographic region 140. The navigable path segments may include the drone navigable space above a road link network 142. The navigable paths may also include drone-specific paths that do not correspond to roads. The mobile device 122 may be onboard the drone 124. The mobile device 122 may be a wireless remote controller that controls the drone 124. The mobile device 122 may communicate with the drone 124 using radio communication (e.g., 900 MHz), the protocols known as Bluetooth, cellular data networks (e.g. GPRS, 3G, LTE, etc.), or the protocols known as the 802.11 standard.

Using input from the end user, the navigation device 122 examines potential routes between the origin location and the destination location to determine the optimum route. The navigation device 122 may then provide the drone 124 or the end user (e.g., drone pilot) with information about the optimum route in the form of guidance that identifies the maneuvers required to be taken by the drone 124 or the end user to travel from the origin to the destination location. Some navigation devices 122 transmit detailed maps to the drone 124 or drone pilot via a wireless control including a display of an outline of the route, the types of maneuvers to be taken at various locations along the route, locations of certain types of features, and so on.

In one example, a three-dimensional or volumetric representation of the drone air space may be presented on the display 221. The processor 210 may generate a computer animation of the drone air space. In another example, the drone 124 may include a camera (e.g., sensor 233) that sends a camera feed of the drone's view to the display 221 to augment the pilots understanding of the flight as well as to preview flights before flying.

The mobile device 122 is also configured to receive, via the input device 233, calculated routes for the drone 124 from the server 125. The mobile device 122 may store these routes in memory 204 or an internal database 133. The processor 210 may access the calculated route from memory 204 or the internal database 133 and communicate, via the communication interface 225, the calculated route to the drone 124. The mobile device 122 is also configured to receive, via the input device 233, wind condition data provided by various sources, such as sensors, other drones or vehicles, or weather services or stations. The mobile device 122 may store the received wind condition data in memory 204 or an internal database 133. The processor 210 may access the wind condition data from memory 204 or the internal database 133 and communicate, via the communication interface 225, the wind condition data to the drone 124.

The mobile device 122 is also configured to receive, via the input device 233, road segment data and 3D map data. The road segment data and 3D map data may be associated with a location 140. The mobile device 122 may store the road segment data, 3D map data, and data that associates the road segment data and 3D map data to a location 140, in memory 204 or an internal database 133. The mobile device 122 is configured to generate a wind model 145 for a location 140 based on the 3D map data and the wind condition data. The wind model 145 may be generated by the processor 210 of the mobile device 122, or by a separate model generator 211 coupled with the processor 210. As discussed above, the wind model 145 may include a wind map that identifies at least one wind path that correlates to a road segment of an underlying road link network 142. The processor 210 is configured to correlate the wind path or paths to the road segment or segments of the underlying road network 142. The wind model 145, wind map, and correlated wind paths may be stored in the database 133.

The input device 223 may receive settings or instructions to select one or more sensors 233 contained therein and whether, and when, to collect data from the one or more sensor 233. The input device 223 may also receive settings or instructions regarding whether, and when, to send the collected sensor data from the one or more sensors 233 to another device or system. The input device 223 may receive data from other devices or systems, such as wind condition data, flight paths/plans, or calculated routes. Additional, different, or fewer components are possible for the mobile device 122.

The position circuitry 227 or the processor 210 may detect a geographic position of the mobile device 122, or the drone 124 if the mobile device 122 in integrated into a drone 124, and may send the geographic location for the mobile device 122 to a server. The position circuitry 227 is one example means for detecting or determining a geographic position. The processor 210 also includes circuitry serving as means for detecting or determining a geographic position. The detected geographic position of the mobile device 122 may include a latitude and longitude pair. The geographic position may be detected or sampled at periodic intervals in time or distance. The sensor 233, which may include distancing sensors, range sensor, image sensors, or another sensor as described above may also provide information for determining the geographic position of the mobile device 122.

The processor 210 or the communication interface 225 may also receive settings or instructions to select one or more sensors 233 contained therein and whether, and when, to collect data, such as wind condition data, from the one or more sensor 233. The processor 210 or the communication interface 225 may also receive settings or instructions regarding whether, and when, to send the collected sensor data from the one or more sensors 233 to another device or system. The selection, if manual, may be made by a display 221 or input device 223 or opening a mobile application (i.e., attempting to use a mobile application), or by making selections from a menu. The communication interface 225 is an example for a means for receiving data indicative of the manual sensor selection, including what sensors to collect data from and whether, and when, to send that data to another device or system. The display 221 or input device 223 are examples of means for receiving the manual selection of the one or more sensors. For automatic selection of sensors, the processor 210 may include circuitry or a module or an application specific controller as a means for receiving the data indicative of the sensor selection, including what sensors to collect data from and whether, and when, to send that data to another device or system.

The display 221 or input device 223 of the mobile device 122 may notify an operator of their selections or of the status of the drone 124 flight path or routing process described below. The display 221 or input device 223 of the mobile device 122 may also display sensor data associated with locations, such as wind condition data, as well as other data, including wind factor values associated with road links and predefined thresholds associated with those wind factor values.

The mobile device 122 may include various types of communication interfaces or communication with the network 127 as the communication network characteristic. The types may include cellular devices (e.g., 3G, 4G, 4G-LTE, 5G or later developed mobile standards), wireless fidelity devices (e.g., IEEE 802.11 family of standards), or another type of device. The mobile device 122 may be configured with access technologies such as WiMAX, 3rd Generation Partnership Project (3GPP) standards, 3GPP2 and WLAN based access architectures. The types of communication may be telephonic, text message, instant message, short message service, or mobile application communication. The 5G may include Edge Computing, which allows very low latency communication, as processing is done at the "edge" of the network, e.g. at the access point. This would allow for data at the mobile device 122 to be collected and distributed quickly among participants in the vicinity of the access point. Drones in autonomous mode may communicate with other drones nearby through this mechanism.

Figure 9:
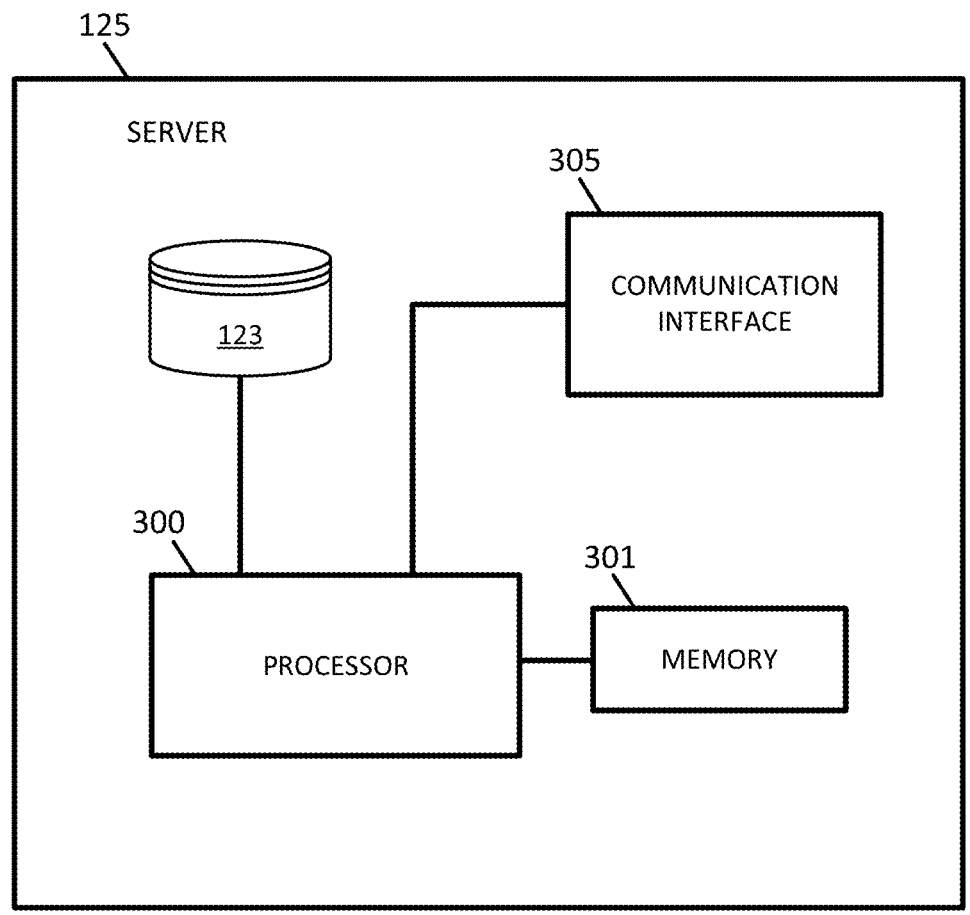
FIG. 9 illustrates an example server.

FIG. 9 illustrates an example server 125, which may apply to either the map developer system or third-party system of FIG. 1. The server 125 includes a processor 300, a communication interface 305, a memory 301, and a database 123. An input device (e.g., keyboard or personal computer) may be used to enter settings to the server 125. Additional, different, or fewer components may be provided in the server 125. Alternatively, the server 125, or server component, tasked with determining link level wind factors used for routing drones may also be implemented onboard a drone 124 or mobile device 122, and may rely on offline databases or online information sources.

Figure 10:
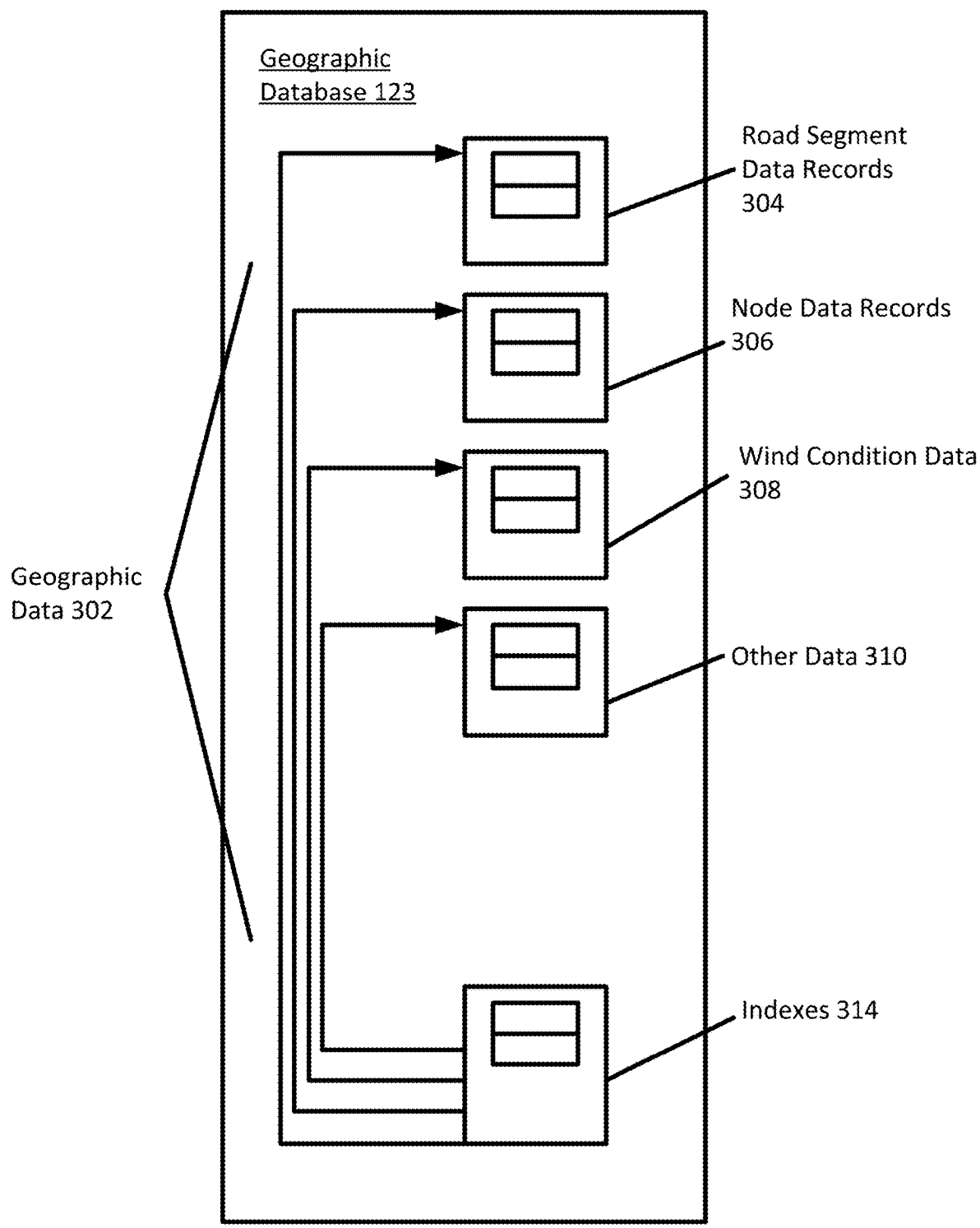
FIG. 10 illustrates an example geographic database.

FIG. 10 illustrates an example geographic database 123 of FIG. 1 containing geographic data 302. The data 302 contained in the geographic database 123 may include data used for traffic and/or navigation-related applications. The geographic data 302 may include data representing a road network or system including road segment data and node data. The road segment data represent roads, and the node data represent the ends or intersections of the roads. The road segment data and the node data indicate the location of the roads and intersections as well as various attributes of the roads and intersections. Other formats than road segments and nodes may be used for the geographic data 302. The geographic data 302 may include structured cartographic data or pedestrian routes.

In FIG. 10, the geographic database 123 may contain at least one road segment database record 304 (also referred to as "entity" or "entry") for each road segment in a particular geographic region. The geographic database 123 may also include a node database record 306 (or "entity" or "entry") for each node in a particular geographic region. The terms "nodes" and "segments" represent only one terminology for describing these physical geographic features, and other terminology for describing these features is intended to be encompassed within the scope of these concepts. The geographic database 123 may also include wind condition data for specific locations in a particular geographic region. The wind condition data 308 may include current weather data and wind model data. The wind model data includes wind maps that depict wind patterns or paths, as well as wind factor values.

The geographic database 123 may include other kinds of data 310. The other kinds of data 310 may represent other kinds of geographic features or anything else. The other kinds of data may include point of interest (POI) data. For example, the POI data may include POI records comprising a type (e.g., the type of POI, such as restaurant, hotel, city hall, police station, historical marker, ATM, golf course, etc.), location of the POI, a phone number, hours of operation, etc. The other data 310 may also include 3D map data and 3D feature data associated with a location. The data 310 may also include drone data associated with the road segment data 304. For example, the drone data may include drone locations, drone altitudes, and drone flight paths and routes associated with particular road segments contained in the road segment data records 304.

The geographic database 123 also includes indexes 314. The indexes 314 may include various types of indexes that relate the different types of data to each other or that relate to other aspects of the data contained in the geographic database 123. For example, the indexes 314 may relate the nodes in the node data records 306 with the end points of a road segment in the road segment data records 304. As another example, the indexes 314 may relate wind condition data 308 with a road segment in the segment data records 304 or a geographic coordinate. An index 314 may, for example, store data relating to one or more locations and related wind condition data 308 for each location.

The geographic database 123 may also include other attributes of or about roads such as, for example, geographic coordinates, physical geographic features (e.g., lakes, rivers, railroads, municipalities, etc.) street names, address ranges, speed limits, turn restrictions at intersections, and/or other navigation related attributes (e.g., one or more of the road segments is part of a highway or toll way, the location of stop signs and/or stoplights along the road segments), as well as POIs, such as gasoline stations, hotels, restaurants, museums, stadiums, offices, automobile dealerships, auto repair shops, buildings, stores, parks, municipal facilities, other businesses, etc. The geographic database 123 may also contain one or more node data record(s) 306 which may be associated with attributes (e.g., about the intersections) such as, for example, geographic coordinates, street names, address ranges, speed limits, turn restrictions at intersections, and other navigation related attributes, as well as POIs such as, for example, gasoline stations, hotels, restaurants, museums, stadiums, offices, automobile dealerships, auto repair shops, buildings, stores, parks, etc. The geographic data 302 may additionally or alternatively include other data records such as, for example, POI data records, topographical data records, cartographic data records, routing data, and maneuver data. Other contents of the database 123 that may be relevant for this invention are: temperature, altitude or elevation, lighting, humidity, atmospheric pressure, wind speed, the presence of magnetic fields, electromagnetic interference, or radio- and micro-waves, cell tower and wi-fi information, such as available cell tower and wi-fi access points, and attributes pertaining to specific approaches to a specific location.

The geographic database 123 may include historical drone traffic data associated to one or more road segments. The geographic database 123 may also include drone traffic attributes for one or more road segments. A traffic attribute may indicate that a road segment has a high probability of drone traffic congestion.

The geographic database 123 may be maintained by a content provider (e.g., a map developer). By way of example, the map developer may collect geographic data to generate and enhance the geographic database 123. The map developer may obtain data from sources, such as businesses, municipalities, or respective geographic authorities. In addition, the map developer may employ field personnel to travel throughout a geographic region to observe features and/or record information about the roadway. Remote sensing, such as aerial or satellite photography, may be used. The database 123 is connected to the server 125.

The geographic database 123 and the data stored within the geographic database 123 may be licensed or delivered on-demand. Other navigational services or traffic server providers may access the wind condition data and/or the drone data stored in the geographic database 123. Data including the wind condition data or drone data may be broadcast as a service.

Figure 11:
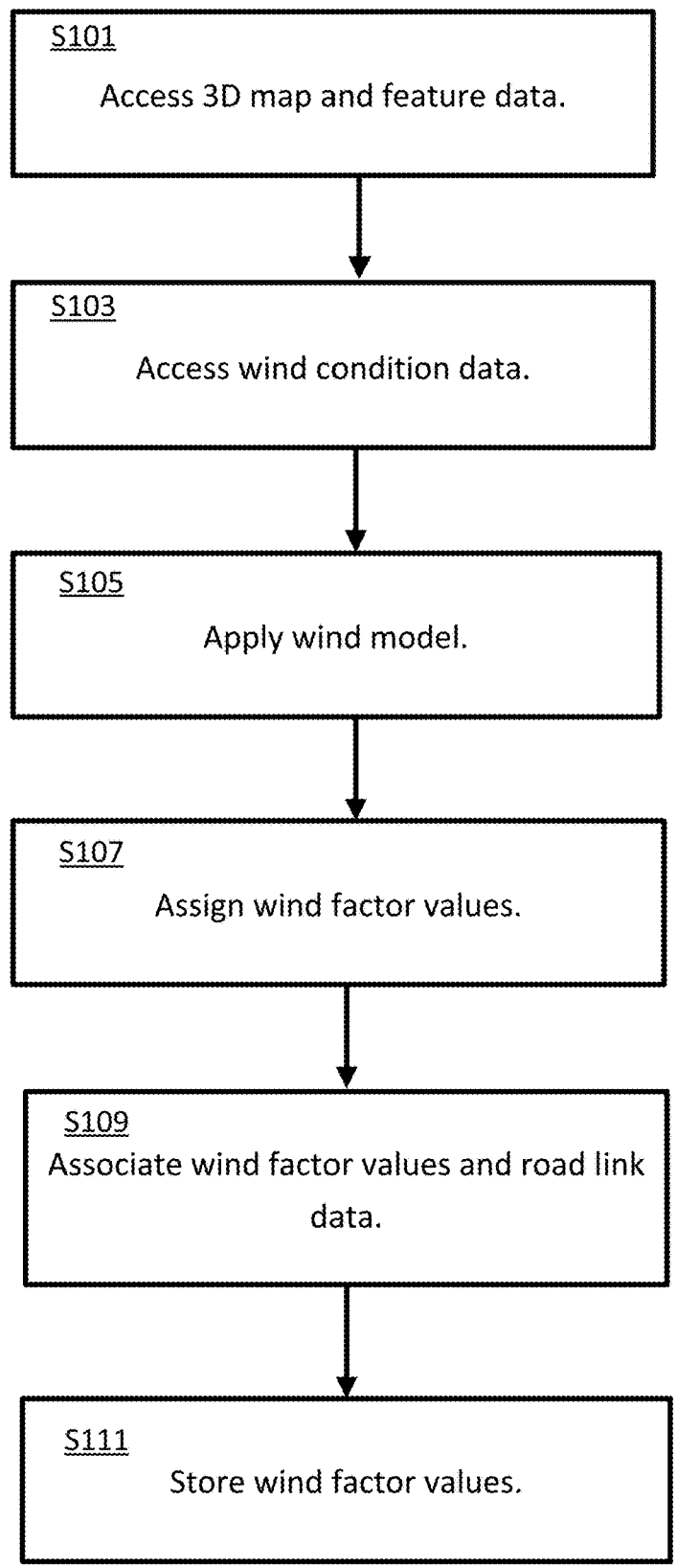
FIG. 11 illustrates an example flowchart for determining and assigning link level wind factors for drone routing.

FIG. 11 illustrates an example flowchart for determining and assigning link level wind factors for drone routing. Wind factor values may be assigned using a drone 124, mobile device 122, server 125, and any components or combinations thereof. Additional, different, or fewer acts may be used.

At act S101, 3D map data, including 3D feature data, is accessed for a location. The processor 210 and/or processor 300 may access the 3D map data and 3D feature data from database 123 and/or database 133. The 3D map data and 3D feature data may be accessed from other types of databases as well. The processor 210 and/or processor 300 may include circuitry or a module or an application specific controller as a means for accessing 3D map data and 3D feature data. The accessed 3D map data and 3D feature data may be associated with a location.

At act S103, wind condition data for the location is accessed. The processor 210 and/or processor 300 may access the wind condition data from a live weather service. The processor 210 and/or processor 300 may also access the wind condition data from database 123 and/or database 133. The wind condition data may be accessed from other types of databases as well. The processor 210 and/or processor 300 may include circuitry or a module or an application specific controller as a means for accessing wind condition data. The accessed wind condition data may be associated with a location.

At act S105, a wind model is applied to the location. The processor 210 and/or processor 300 may apply the wind model to the location based on the 3D map data, including 3D feature data, and the wind condition data. The wind model may be applied to other locations as well. The processor 210 and/or processor 300 may include circuitry or a module or an application specific controller as a means for applying the wind model to the location. The wind model may be applied using a fluid dynamics simulation. The wind model may be applied using a physical 3D model of the location and a wind tunnel. The wind model may be applied using current and/or historical wind data for the location.

At act S107, wind factor values are assigned for the location. The processor 210 and/or processor 300 may assign the wind factor values. The wind factor values may be assigned to a plurality of altitudes of air space at the location. The processor 210 and/or processor 300 may receive data indicative of an assignment of wind factor values, for example from a communication interface 225 and/or communication interface 305. The communication interface 225 and/or communication interface 305 may be a means for receiving data indicative of an assignment of wind factor values. The processor 210 and/or processor 300 may include circuitry or a module or an application specific controller as a means for assigning wind factor values.

At act S109, the wind factor values are associated to a location. The processor 210 and/or processor 300 may associate the wind factor values to road link data at the location. More specifically, the wind factor values may be associated to a plurality of altitudes of air space above a road link at the location. The processor 210 and/or processor 300 may include circuitry or a module or an application specific controller as a means for associating the wind factor values to the road link data of the road link network associated with the location.

At act S111, the wind factor values assigned in act S107 that are associated in act S109 with the location are stored in database 123 and/or database 133. The associated wind factor values may be stored in other types of databases as well. The processor 210 and/or processor 300 may include circuitry or a module or an application specific controller as a means for storing the associated wind factor values.

Figure 12:
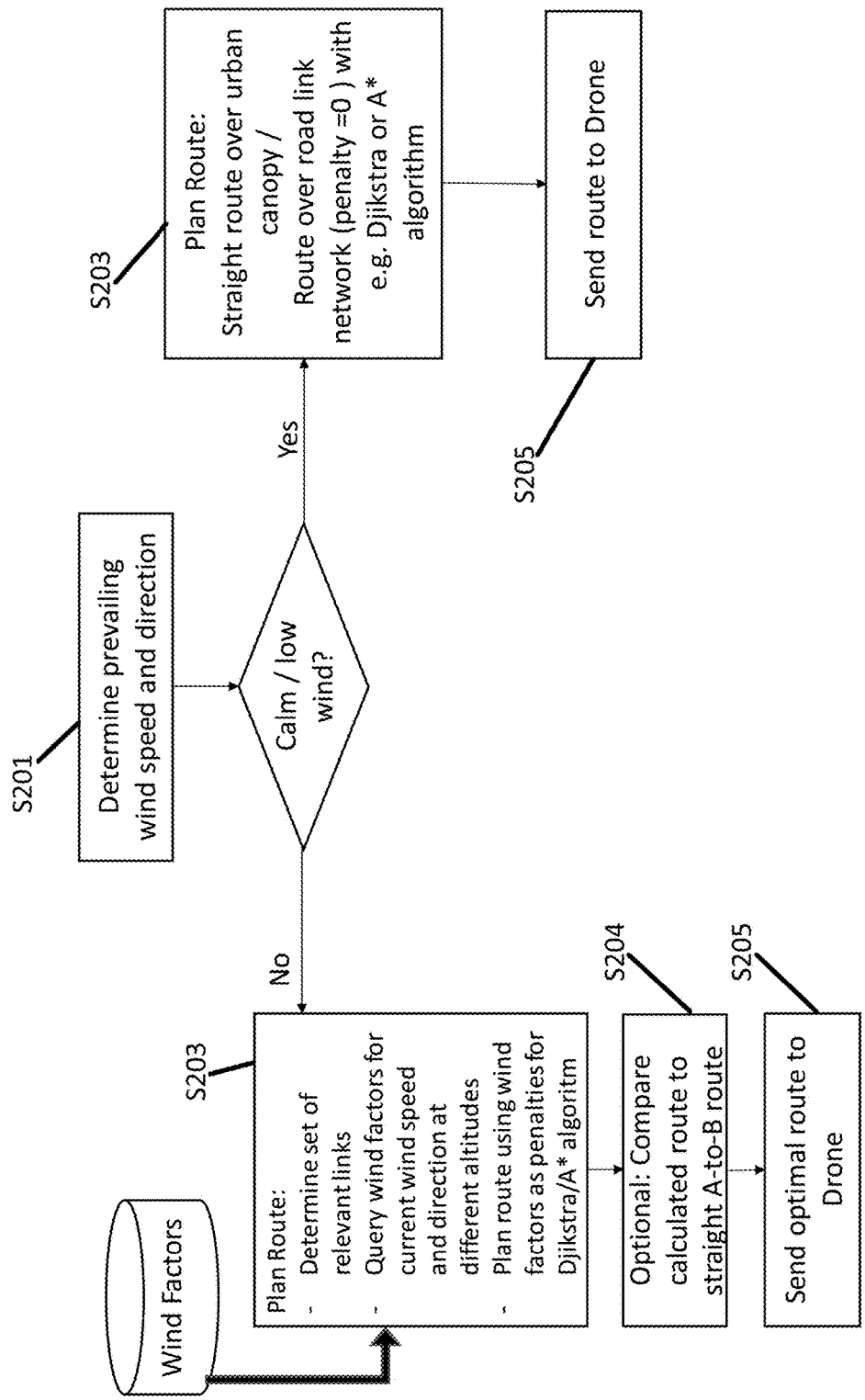
FIG. 12 illustrates an example flowchart for planning a drone route using the link level wind factors assigned in FIG. 11.

FIG. 12 illustrates an example flowchart for calculating, or planning, a drone route using the link level wind factors assigned in FIG. 11.

At act S201, a prevailing wind speed and direction is determined for a location. The processor 210 and/or processor 300 may determine the prevailing wind speed and direction for the location. The prevailing wind speed and direction may be determined for a plurality of altitudes of air space at the location. The processor 210 and/or processor 300 may include circuitry or a module or an application specific controller as a means for determining the prevailing wind speed and direction at the location.

At act S203, the drone route is planned. The processor 210 and/or processor 300 may plan the drone route. If the prevailing wind speed and direction is determined in act S201 to be calm (i.e., low wind speed), the processor 210 and/or processor 300 may plan the drone route to be a straight route over the urban canopy or a route over the road link network 142 using known ground-level routing algorithms, such as the Dijkstra or A* algorithms. If the prevailing wind speed and direction is determined in act S201 not to be calm (i.e., high wind speed), the processor 210 and/or processor 300 may plan the drone route by determining a set of relevant links (i.e., road links associated with the location of the drone), querying wind factor values from a database for current wind speed and direction at different altitudes, and planning the route over the road link network 142 using road link edge weights, based on the wind factors as penalties (i.e., time delays) for a given road link, for the Dijkstra or A* algorithms.

Optionally, at act S204, the planned route of act S203 when the prevailing wind speed and direction was determined in act S201 not to be calm is compared to a straight A-to-B route (i.e., straight route between origin and destination) to determine which of the two routes is optimal. The processor 210 and/or processor 300 may determine which of the two route options is optimal. The processor 210 and/or processor 300 may include circuitry or a module or an application specific controller as a means for determining which of the two drone routes is optimal.

At act S205, the drone route that is planned in act S203, or the optimal drone route determined in act S204, is sent to the drone 124. Other routes may be sent to the drone as well. The route planned in act S203, or the optimal drone route determined in act S204, may be sent to multiple drones, such as a fleet of drones. The processor 210 and/or processor 300 may send the route to the drone 124 or drones. The processor 210 and/or processor 300 may include circuitry or a module or an application specific controller as a means for sending the route to the drone 124 or drones.

Figure 13:
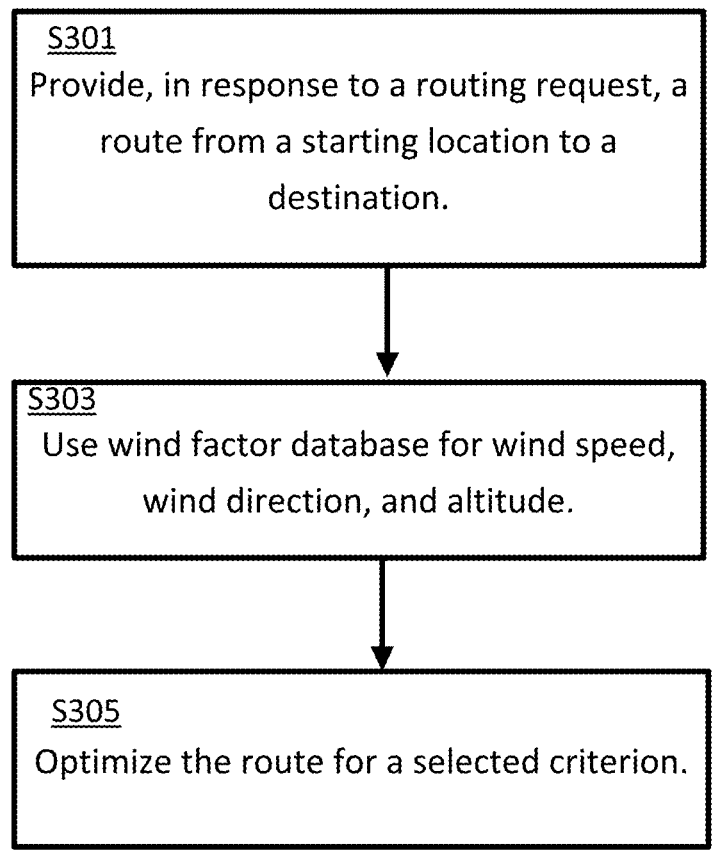
FIG. 13 illustrates an example flowchart for providing a route to a drone.

FIG. 13 illustrates an example flowchart for providing a route to a drone using the link level wind factors assigned in FIG. 11. Additional, different, or fewer acts may be used.

At act S301, a route from a starting location to a destination is provided in response to a routing request for a drone 124. At least a portion of the route corresponds to airspace above a road network in a geographic region. The routing request may include drone-specific information, such as the type and size of the drone 124, a unique drone identification number, the drone operator/owner information (such as registration and licensing information), etc. Based on the provided drone-specific information, the processor 210 and/or processor may access a database 123 to determine operational thresholds of the drone, such as what the drone 124 is being used for, the fuel capacity of the drone 124, maximum and minimum operating speeds of the drone 124, maximum operating wind speed for the drone 124, maximum travel distance, the weight of the drone 124, etc. The processor 210 and/or processor 300 may provide the route to the drone 124 or drones. The processor 210 and/or processor 300 may include circuitry or a module or an application specific controller as a means for providing the route to the drone 124 or drones.

At act S303, a wind factor value database is used for the portion of the route that corresponds to airspace above a road network. The wind factor database may include factors for wind speed, wind direction, and altitude above the road network. The wind factor database may include other factors as well. The processor 210 and/or processor 300 may use the wind factor value database. The processor 210 and/or processor 300 may include circuitry or a module or an application specific controller as a means for using the wind factor value database.

At act S305, the route provided in act S301 is optimized for a selected criterion. The selected criterion may be minimal time to traverse the route, minimal energy consumption, or the least likelihood of crashing. The selected criterion may include other criteria as well. The processor 210 and/or processor 300 may optimize the route provided in act S301. The processor 210 and/or processor 300 may include circuitry or a module or an application specific controller as a means for optimizing the route provided in act S301.

The use of wind models 145 based on 3D map data associated with an underlying road link network 142 to route drones 124 has broad applications in the UAV industry and provides many benefits. Optimal drone navigation routes may be more easily defined. Flight routes for drones used for delivery or transport could utilize wind patterns to the benefit of the drone and operator. Safety of the drones and their cargo may be improved by avoiding crashes caused by wind. Knowing and utilizing incentive wind factors, or positive wind patterns, and avoiding penalty wind factors, or negative wind patterns, may improve the comfort and safety of transporting people with drones in the future. Taking advantage of drone routes with incentive wind factors, or positive wind patterns, may also decrease drone travel times and lead to energy savings. All of these benefits may equally apply to drones operated remotely by humans or autonomous, self-flying drones.

Referring back to FIG. 10, the path segment data records may also include an attribute for functional class, which is accessed by the mobile device 122 or the server 125 for the examples disclosed herein. The functional class of the road segment may be described as a numerical value (e.g., 1, 2, 3, 4, and 5). Functional class 1 may be highways while functional class 5 may be small streets.

One example of a simple system includes the functional classification maintained by the United States Federal Highway administration. The simple system includes arterial roads, collector roads, and local roads. The functional classifications of roads balance between accessibility and speed. An arterial road has low accessibility but is the fastest mode of travel between two points. Arterial roads are typically used for long distance travel. Collector roads connect arterial roads to local roads. Collector roads are more accessible and slower than arterial roads. Local roads are accessible to individual homes and business. Local roads are the most accessible and slowest type of road.

An example of a complex functional classification system is the urban classification system. Interstates include high speed and controlled access roads that span long distances. The arterial roads are divided into principle arteries and minor arteries according to size. The collector roads are divided into major collectors and minor collectors according to size. Another example functional classification system divides long distance roads by type of road or the entity in control of the highway. The functional classification system includes interstate expressways, federal highways, state highways, local highways, and local access roads. Another functional classification system uses the highway tag system in the Open Street Map (OSM) system. The functional classification includes motorways, trunk roads, primary roads, secondary roads, tertiary roads, and residential roads.

In addition to the functional classification system for the terrestrial roads, the database 123 may also assign functional classification values to the drone path segments. The functional classification values to the drone path segments may define the size of a buffer space, travel speeds of drones permitted, travel heights of drones permitted, or the types of drones permitted along the drone path segments. The functional classification values assigned to the drone path segments may not directly correlate with the functional classification system for terrestrial roads.

The database 123 may be master geographic databases stored in a format that facilitates updating, maintenance, and development. For example, a master geographic database or data in the master geographic database is in an Oracle spatial format or other spatial format, such as for development or production purposes. The Oracle spatial format or development/production database may be compiled into a delivery format such as a geographic data file (GDF) format. The data in the production and/or delivery formats may be compiled or further compiled to form geographic database products or databases that may be used in end user navigation devices or systems.

For example, geographic data is compiled (such as into a physical storage format (PSF) format) to organize and/or configure the data for performing navigation-related functions and/or services, such as route calculation, turn by turn navigation instructions, route guidance, map display, speed calculation, distance and travel time functions, and other functions, by a navigation device. The navigation-related functions may correspond to vehicle navigation, pedestrian navigation, or other types of navigation. The compilation to produce the end user databases may be performed by a party or entity separate from the map developer. For example, a customer of the map developer, such as a navigation device developer or other end user device developer, may perform compilation on a received geographic database in a delivery format to produce one or more compiled navigation databases.

Communication between the mobile device 122 and the server 125 through the network 127 may use a variety of types of wireless networks. Example wireless networks include cellular networks, the family of protocols known as WiFi or IEEE 802.11, the family of protocols known as Bluetooth, or another protocol. The cellular technologies may be analog advanced mobile phone system (AMPS), the global system for mobile communication (GSM), third generation partnership project (3GPP), code division multiple access (CDMA), personal handy-phone system (PHS), and 4G or long-term evolution (LTE) standards, or another protocol.

The processor 210 and/or processor 300 may include a general processor, digital signal processor, an application specific integrated circuit (ASIC), field programmable gate array (FPGA), analog circuit, digital circuit, combinations thereof, or other now known or later developed processor. The processor 210 and/or processor 300 may be a single device or combinations of devices, such as associated with a network, distributed processing, or cloud computing.

The memory 204 and/or memory 301 may be a volatile memory or a non-volatile memory. The memory 204 and/or memory 301 may include one or more of a read only memory (ROM), random access memory (RAM), a flash memory, an electronic erasable program read only memory (EEPROM), or other type of memory. The memory 204 and/or memory 801 may be removable from the mobile device 122, such as a secure digital (SD) memory card.

The communication interface 225 and/or communication interface 305 may include any operable connection. An operable connection may be one in which signals, physical communications, and/or logical communications may be sent and/or received. An operable connection may include a physical interface, an electrical interface, and/or a data interface. The communication interface 225 and/or communication interface 305 provides for wireless and/or wired communications in any now known or later developed format.

The input device 223 may be one or more buttons, keypad, keyboard, mouse, stylus pen, trackball, rocker switch, touch pad, voice recognition circuit, or other device or component for inputting data to the mobile device 122. The input device 223 and display 221 may be combined as a touch screen, which may be capacitive or resistive. The display 221 may be a liquid crystal display (LCD) panel, light emitting diode (LED) screen, thin film transistor screen, or another type of display. The output interface of the display 221 may also include audio capabilities, or speakers. In an embodiment, the input device 223 may involve a device having velocity detecting abilities.

The positioning circuitry 227 may include suitable sensing devices that measure the traveling distance, speed, direction, and so on, of the mobile device 122. The positioning system may also include a receiver and correlation chip to obtain a GPS signal. Alternatively or additionally, the one or more detectors or sensors may include an accelerometer and/or a magnetic sensor built or embedded into or within the interior of the mobile device 122. The accelerometer is operable to detect, recognize, or measure the rate of change of translational and/or rotational movement of the mobile device 122. The magnetic sensor, or a compass, is configured to generate data indicative of a heading of the mobile device 122. Data from the accelerometer and the magnetic sensor may indicate orientation of the mobile device 122. The mobile device 122 receives location data from the positioning system. The location data indicates the location of the mobile device 122.

The positioning circuitry 227 may include a Global Positioning System (GPS), Global Navigation Satellite System (GLONASS), or a cellular or similar position sensor for providing location data. The positioning system may utilize GPS-type technology, a dead reckoning-type system, cellular location, or combinations of these or other systems. The positioning circuitry 227 may include suitable sensing devices that measure the traveling distance, speed, direction, and so on, of the mobile device 122. The positioning system may also include a receiver and correlation chip to obtain a GPS signal. The mobile device 122 receives location data from the positioning system. The location data indicates the location of the mobile device 122.

The position circuitry 227 may also include gyroscopes, accelerometers, magnetometers, or any other device for tracking or determining movement of a mobile device. The gyroscope is operable to detect, recognize, or measure the current orientation, or changes in orientation, of a mobile device. Gyroscope orientation change detection may operate as a measure of yaw, pitch, or roll of the mobile device.

The mobile device 122, or only the drone 124 in other embodiments, may also include an environmental sensor to detect the environment of the drone 124. The environment sensor may include a weather sensor such as a thermometer, barometer, or a rain sensor. In addition, the drone 124 or the mobile device 122 may include sensor 115, 116, 233 or another sensor as an optical sensor such as a LiDAR device, a proximity sensor, or another sensor configured to detect distances to nearby objects or when a nearby object exists. The optical sensor may send a signal that reflects off another object and is detected by the optical sensor. The inertial sensor may include an inertial measurement unit (IMU) including one or more of an accelerometer, a gyroscope, and a magnetic sensor. The inertial sensor may generate data indicative of the acceleration, deceleration, rotational acceleration, and rotational deceleration experienced by the vehicle.

The term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. These examples may be collectively referred to as a non-transitory computer readable medium.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having essentially the same functions. Accordingly, replacement standards and protocols having the same or similar functions as those disclosed herein are considered equivalents thereof.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

As used in this application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. Generally, a processor receives instructions and data from a read only memory or a random access memory or both. The essential elements of a computer are a processor for performing instructions and one or more memory devices for storing instructions and data. Generally, a computer also includes, or is operatively coupled to receive data from or transfer data to, or both, one or more mass storage devices for storing data, e.g., magnetic, magneto optical disks, solid state storage or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks, solid state storage or removable disks; magneto optical disks; and CD ROM and DVD-ROM disks. The processor and the memory can be supplemented by, or incorporated in, special purpose logic circuitry. In an embodiment, a vehicle or drone may be considered a mobile device, or the mobile device may be integrated into a vehicle or drone.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

The following example embodiments of the invention are also disclosed:

Embodiment 1

A method of determining link level wind factors for unmanned aerial vehicle (UAV) routing. The method comprising: accessing, by a processor, three-dimensional (3D) features from 3D map data for a location and road link data for a road link network associated with the location; accessing, by the processor, wind condition data for the location; applying, by the processor, a wind model for the location based on the 3D features and the wind condition data; assigning, by the processor, wind factor values for a plurality of altitudes of UAV air space above a link of the road link network based on the wind model; associating, by the processor, the wind factor values and the road link data for the link of the road link network; and storing the wind factor values in a database.

Embodiment 2

The method of embodiment 1, wherein applying the wind model comprises: performing a computational fluid dynamics simulation over the 3D map data associated with the location.

Embodiment 3

The method of embodiment 1 or 2, wherein applying the wind model comprises: receiving real time wind data from sensors at the location, wherein at least one wind factor value is refined based on real time wind data received from sensors at the location.

Embodiment 4

The method of any of the preceding embodiments 1 to 3, wherein storing the wind factor values in the database further comprises: storing the wind factor values such that said wind factor values are queryable using a prevailing wind condition, a link identifier for the corresponding road link, or a combination thereof, as query parameters.

Embodiment 5

The method of any of the preceding embodiments 1 to 4, wherein the wind factor values comprise a measure of wind speed relative to a direction of the corresponding road link.

Embodiment 6

The method of any of the preceding embodiments 1 to 5, wherein the wind factor values further comprise a measure of volatility of the respective wind speed.

Embodiment 7

The method of any of the preceding embodiments 1 to 6, wherein the wind factor values correspond to an altitude in the airspace on the corresponding road link.

Embodiment 8

An apparatus, configured to perform and/or control the method of any of embodiments 1-7 or comprising means for performing and/or controlling any of embodiments 1-7.

Embodiment 9

An apparatus, comprising at least one processor and at least one memory including computer program code for one or more programs, the at least one memory and the computer program code configured to, with the at least one processor, to perform and/or control the method of any of embodiments 1-7.

Embodiment 10

A computer program comprising instructions operable to cause a processor to perform and/or control the method of any of embodiments 1-7, when the computer program is executed on the processor.

Embodiment 11

A method for providing a route for a drone, the method comprising: providing in response to a routing request, with a processor, a route from a starting location to a destination, wherein at least a portion of the route corresponds to airspace above a road network in a geographic region; for the portion of the route that corresponds to airspace above a road network, using a wind factor value database, wherein the wind factor value database includes factors for wind speed, wind direction and altitude above the road network; and optimizing the route for a selected criterion.

Embodiment 12

The method of embodiment 11, wherein the wind factor database further comprises wind speed volatility factors.

Embodiment 13

The method of embodiment 11 or 12, wherein the selected criterion is minimal time to traverse the route or minimal energy consumption.

Embodiment 14

The method of any of the preceding embodiments 11 to 13, wherein the routing request includes drone-specific information, the drone-specific information being used for determining at least one operational threshold of the drone.

Embodiment 15

The method of any of the preceding embodiments 11 to 14, wherein the selected criterion is least likelihood of crashing.

Embodiment 16

The method of any of the preceding embodiments 11 to 15, wherein for at least a portion of the route corresponding to airspace that is not above a road network in the geographic region, and wherein the wind factor value database further comprises values for airspace that is not above a road network, wherein the wind factor value database includes factors for wind speed, wind direction and altitude across the airspace that is not above a road network.

Embodiment 17

The method of any of the preceding embodiments 11 to 16, wherein the optimizing further includes selecting portions for the route that include airspace above the road network and airspace not above the road network based on use of the wind factor value database.

Embodiment 18

The method of any of the preceding embodiments 11 to 17, wherein the selected criterion is shortest path if a prevailing wind condition is below a predetermined threshold.

Embodiment 19

The method of any of the preceding embodiments 11 to 18, wherein calculating the route for a drone further comprises: identifying existing drone flight paths associated with the location; and calculating the drone route based on the existing drone flight paths.

Embodiment 20

The method of any of the preceding embodiments 11 to 19, further comprising: in response to receiving a real-time wind condition update for a location along the route, recalculating the route based on said update; and providing the recalculated route to the drone.

Embodiment 21

An apparatus, configured to perform and/or control the method of any of embodiments 11-20 or comprising means for performing and/or controlling any of embodiments 11-20.

Embodiment 21

An apparatus, comprising at least one processor and at least one memory including computer program code for one or more programs, the at least one memory and the computer program code configured to, with the at least one processor, to perform and/or control the method of any of embodiments 11-20.

Embodiment 22

A computer program comprising instructions operable to cause a processor to perform and/or control the method of any of embodiments 11-20, when the computer program is executed on the processor.

Embodiment 23

An apparatus for determining link level wind factors for unmanned aerial vehicle (UAV) routing, the apparatus comprising: a database configured to store three-dimensional (3D) features and map data for a location, the map data including road link data for a road link network associated with the location; and a controller configured to apply a wind model for the location based on the 3D features and wind condition data for the location and associate wind factor values with the road link data for a link of the road link network, wherein the wind factor values are for a plurality of altitudes of UAV air space above the link of the road link network based on the wind model.

Embodiment 24

The apparatus of embodiment 23, wherein the controller, to apply the wind model, is configured to perform a computational fluid dynamics simulation over the map data associated with the location.

Embodiment 25

The apparatus of embodiment 23 or 24, wherein at least one wind factor value is refined based on real time wind data received from sensors associated with the location.

Embodiment 26

The apparatus of any of the preceding embodiments 23 to 25, wherein the wind factor values comprise a measure of wind speed relative to a direction of the corresponding road link, the wind factor values further comprise a measure of volatility of the wind speed relative to the direction of the corresponding road link, or an altitude in the airspace on the corresponding road link.

Embodiment 27

An apparatus for providing a route for a drone, the apparatus comprising: a wind factor value database configured to store factors for wind speed, wind direction and altitude above a road network and associated with road link data for the road network; a communication interface configured to receive a routing request; and a processor configured to calculate, in response to the routing request, a route from a starting location to a destination, wherein at least a portion of the route corresponds to airspace above the road network in a geographic region selected based on the factors from the wind factor value database and a selected criterion.

Embodiment 28

The apparatus of embodiment 27, wherein the selected criterion is minimal time to traverse the route, minimal energy consumption, or least likelihood of crashing.

Embodiment 29

The apparatus of embodiment 27 or 28, wherein the selected criterion is shortest path if a prevailing wind condition is below a predetermined threshold.

Embodiment 30

The apparatus of any of the preceding embodiments 27 to 29, wherein the communication interface is configured to send the route to the drone.

Embodiment 31

The apparatus of any of the preceding embodiments 27 to 30, wherein, in response to receiving a real-time wind condition update along the route, the processor is configured to recalculate the route based on said update and the communication interface is configured to provide the recalculated route to the drone.

We claim:

1. A method of controlling a drone, the method comprising:
   identifying, by a processor, wind factor values associated with a road link network associated with a location, wherein the wind factor values are based on a wind model;
   receiving, by the processor, wind factor values for each road link of the road link network associated with the location;
   calculating, by the processor, a route for the drone through air space above the road link network based on the received wind factor values; and
   generating a navigation command for the drone based on the calculated route.

2. The method of claim 1, wherein the identifying is based on a query, and further comprising:
   inputting, as one or more query parameters, one or more road link identifiers, a prevailing wind direction, a prevailing wind speed, one or more altitudes, a maximum or minimum incentive, a maximum or minimum penalty, a balanced or smooth transition between wind factor values of adjacent road links of the road link network, or combinations thereof.

3. The method of claim 2, wherein receiving comprises receiving, when no altitude is input as one of the one or more query parameters, a range of wind factor values for a corresponding range of altitudes associated with each road link of the road link network.

4. The method of claim 2, wherein receiving comprises receiving, when a single altitude is input as one of the one or more query parameters, a single wind factor value for the single altitude.

5. The method of claim 2, wherein receiving comprises receiving, when one or more altitudes are input as one or more query parameters, wind factor values for the corresponding one or more altitudes.

6. The method of claim 1, wherein a wind factor value of the wind factor values comprises an expected wind speed relative to a direction of travel along a road link of the road link network.

7. The method of claim 1, wherein the wind factor values comprise values expressed as an incentive or a penalty, wherein a positive wind factor value is indicative of an incentive wind factor and a negative wind factor value is indicative of a penalty wind factor.

8. The method of claim 7, wherein the incentive wind factor comprises an expected wind speed along a direction of travel of the drone and the penalty wind factor comprises an expected wind speed along an opposite direction of travel of the drone.

9. The method of claim 8, wherein the incentive wind factor is indicative of a reduction in travel time of the drone and penalty wind factor is indicative of an increase in travel time of the drone.

10. The method of claim 7, wherein calculating the route for the drone comprises prioritizing incentive wind factors over penalty wind factors.

11. The method of claim 1, wherein a wind factor value of the wind factor values further comprises a wind factor volatility value indicative of a degree of fluctuation of a wind factor at a corresponding altitude.

12. The method of claim 1, further comprising:
applying the wind model to the location, wherein the wind model comprises a fluid dynamics simulation model based on three-dimensional features and wind condition data associated with the location.

13. The method of claim 1, wherein calculating the route for the drone comprises calculating an optimal route that travels through a plurality of altitudes of air space above the road link network based on the received wind factor values, wherein the received wind factor values include wind factor values for the plurality of altitudes of air space.

14. The method of claim 1, wherein the route for the drone is based on a predetermined threshold wind factor value, the predetermined threshold wind factor value being indicative of whether wind conditions at the location will impact the drone.

15. The method of claim 14, wherein the predetermined threshold wind factor value is predetermined based on a maneuverability of air space above the road link network or drone-specification information.

16. The method of claim 15, wherein the drone-specific information comprises a type or size of the drone, an energy level or fuel capacity of the drone, a type of cargo carried by the drone, drone owner or operator information, a maximum and a minimum operating speed of the drone, a maximum travel distance of the drone, a weight of the drone, or combinations thereof.

17. The method of claim 1, wherein the navigation command includes a directional command configured to control an altitude of the drone, a speed of the drone, a direction of flight of the drone, an angle of flight of the drone, or combinations thereof.

18. The method of claim 1, further comprising:
optimizing the route for the drone for a minimal time to traverse the route, a minimal energy consumption, a type of drone cargo, or a likelihood of crashing.

19. The method of claim 1, further comprising:
receiving, by the processor, updated wind factor values based on the wind model using sensor data from a sensor at the location, wind condition data for the location from a weather service or station, updated three-dimensional map data for the location, or combinations thereof;
re-calculating, by the processor, the route for the drone through air space above the road link network based on the received updated wind factor values; and
generating an updated navigation command for the drone based on the re-calculated route.

20. An apparatus for controlling a drone, the apparatus comprising:
a wind factor value database configured to store wind factor values for a road link network associated with a location, wherein the wind factor values in the wind factor value database are based on a wind model and associated with the road link network;
a communication interface configured to receive wind factor values for each road link of the road link network associated with the location; and
a processor configured to calculate a route for the drone through air space above the road link network based on the received wind factor values and generate a navigation command for the drone based on the calculated route.

* * * * *